US007167151B2

(12) United States Patent
Yamashita

(10) Patent No.: US 7,167,151 B2

(45) Date of Patent: Jan. 23, 2007

(54) ACTIVE MATRIX SUBSTRATE

(75) Inventor: Hidehiko Yamashita, Oxfordshire (GB)

(73) Assignee: Sharp Kabushiki Kaisha, Osaka (JP)

( * ) Notice: Subject to any disclaimer, the term of this patent is extended or adjusted under 35 U.S.C. 154(b) by 127 days.

(21) Appl. No.: 10/360,931

(22) Filed: Feb. 10, 2003

(65) Prior Publication Data

US 2003/0151587 A1 Aug. 14, 2003

(30) Foreign Application Priority Data

Feb. 13, 2002 (JP) ............................ 2002-035896

(51) Int. Cl.
*G01R 31/00* (2006.01)

(52) U.S. Cl. ........................................ 345/98; 324/770

(58) Field of Classification Search ................ 345/102, 345/770, 98; 324/770; 348/206; 359/59
See application file for complete search history.

(56) References Cited

U.S. PATENT DOCUMENTS

| | | | | | |
|---|---|---|---|---|---|
| 5,506,516 | A | * | 4/1996 | Yamashita et al. | 324/770 |
| 5,576,730 | A | * | 11/1996 | Shimada et al. | 345/98 |
| 5,714,771 | A | | 2/1998 | Misawa et al. | 345/100 |
| 5,754,158 | A | | 5/1998 | Misawa et al. | 257/72 |

FOREIGN PATENT DOCUMENTS

| | | |
|---|---|---|
| JP | 62-044717 | 2/1987 |
| JP | 63-123093 | 5/1988 |
| JP | 01-129295 | 5/1989 |
| JP | 01-225996 | 9/1989 |
| JP | 03-018891 | 1/1991 |
| JP | 5-5866 | 1/1993 |
| JP | 06-250225 | 9/1994 |
| JP | 07-325555 | 12/1995 |
| JP | 07-327185 | 12/1995 |
| JP | 08-335059 | 12/1996 |
| JP | 10-214065 | 8/1998 |
| JP | 11-073165 | 3/1999 |

(Continued)

OTHER PUBLICATIONS

Chinese Office Action mailed Feb. 18, 2005 (w/English translation thereof).

(Continued)

*Primary Examiner*—Amr A. Awad
*Assistant Examiner*—Steven Holton
(74) *Attorney, Agent, or Firm*—Nixon & Vanderhye P.C.

(57) ABSTRACT

Each of a plurality of source lines is connected to a video signal line via an analog switch and a read-out switch, which are turned ON/OFF by a source line driving circuit. When the analog switch of the source line is turned ON and the read-out switch thereof is turned OFF, the selected source line is connected to the video signal line, thereby writing a video signal to a storage capacitor of a picture element via a picture element transistor. When the analog switch of the source line is turned OFF and the read-out switch thereof is turned ON, a signal stored in a storage capacitor is read out from the source line to the read-out line via the picture element transistor. The read-out line is a single line shared by the plurality of source lines.

17 Claims, 15 Drawing Sheets

FOREIGN PATENT DOCUMENTS

| | | |
|---|---|---|
| JP | 11-085111 | 3/1999 |
| JP | 2000-047255 | 2/2000 |
| JP | 2002-222261 | 8/2001 |
| JP | 2001-337637 | 12/2001 |

OTHER PUBLICATIONS

Japanese Office Action mailed Apr. 25, 2006 (w/English translation thereof).

Japanese Office Action issued Aug. 1, 2006 (w/English translation thereof).

* cited by examiner

ACTIVE MATRIX SUBSTRATE

BACKGROUND OF THE INVENTION

1. Field of the Invention

The present invention relates to an active matrix substrate including a source line driving circuit. More particularly, the present invention relates to an active matrix substrate including a source line driving circuit with an amplifier at the final output stage for outputting data to a source bus line, for example.

2. Description of the Background Art

Referring to FIG. 14, a liquid crystal display device with a built-in driving circuit will be described as an example of a conventional electrooptical device with a built-in driving circuit. The liquid crystal display device includes a plurality of pixel sections 3 arranged in a matrix pattern on a substrate, each pixel section 3 including a picture element transistor 1 and a storage capacitor 2 connected to the picture element transistor 1 for storing a charge. Gate bus lines 6 and source bus lines 9 are arranged so that they extend perpendicular to each other. The gate of the picture element transistor 1 is connected to the gate bus line 6, and the source of the picture element transistor 1 is connected to the source bus line 9. On the other hand, one terminal of the storage capacitor 2 that is not connected to the picture element transistor 1 is connected to a common electrode line 7 extending in a direction parallel to the gate bus line 6, i.e., perpendicular to the source bus line 9, and the common electrode line 7 is connected to one terminal 16.

The liquid crystal display device is driven as follows for displaying an image. A gate line driving circuit 5 outputs an ON signal successively to the rows of gate bus lines 6 to turn ON the picture element transistor 1 of all the rows of gate bus lines 6 to which the ON signal is output. Moreover, while the ON signal is being output to a gate bus line 6, a source line driving circuit 8 outputs an ON signal successively to analog switches 10 provided along the source bus lines 9, respectively. Thus, the source bus line 9 that is connected to the analog switch 10, being turned ON, is connected to a corresponding video signal line 12, thereby turning ON the picture element transistor 1 via the source bus line 9. The video signal from a terminal 13 is written, via the picture element transistor 1, to the storage capacitor 2 and to a picture element capacitor in a liquid crystal layer (not shown) between an active matrix substrate and a counter substrate.

Moreover, the video signal, which is thus written to the storage capacitor 2 and to the picture element capacitor is held by turning OFF the picture element transistor 1 while the gate line driving circuit 5 is outputting the ON signal to the other rows of gate bus lines 6. Then, after the gate line driving circuit 5 outputs the ON signal to all of the rows of gate bus lines 6, the above operation is repeated by outputting the ON signal successively starting from the first row.

The active matrix substrate can easily be inspected for defects through an optical inspection process after the active matrix substrate is attached to the opposing counter substrate via the liquid crystal layer therebetween so that the assembly can operate as a liquid crystal display device (see, for example, Japanese Laid-Open Patent Publication No. 63-123093). However, such an inspection method requires each liquid crystal panel to actually display a picture thereon, and thus takes a long time, whereby a high productivity cannot be expected. Moreover, with this inspection method, if an active matrix substrate is determined to be defective, the entire liquid crystal panel needs to be disposed of, whereby the assembly step of attaching the active matrix substrate to the counter substrate and the liquid crystal injection step may possibly be wasted completely. Therefore, it is desired to inspect an active matrix substrate after the picture element transistors 1, etc., are formed thereon, so that it can be forwarded to the assembly step of attaching the active matrix substrate to the counter substrate after correcting any defects, if possible.

One way to inspect an active matrix substrate before the assembly step is to form inspection circuits 111 to 114, as illustrated in FIG. 15, on the substrate. The inspection circuits 111 and 112 are circuits for leading the outputs at the last stage of shift registers in a gate line driving circuit 105 and a source line driving circuit 106 to inspection pads 111*a* and 112*a*, respectively. Thus, the gate line driving circuit 105 and the source line driving circuit 106 can be inspected by operating the circuits 105 and 106 while monitoring their outputs at the inspection pads 111*a* and 112*a*.

Moreover, the inspection circuit 113 is a circuit by which gate bus lines 101 are all connected to an inspection pad 113*b* via respective switches 113*a*. Furthermore, the inspection circuit 114 is a circuit by which source bus lines 102 are all connected to an inspection pad 114*b* via respective switches 114*a*.

The switches 113*a* and the switches 114*a* are turned ON/OFF by a signal from an inspection pad 113*c* and by a signal from an inspection pad 114*c*, respectively. Therefore, the gate bus line 101, for example, can be inspected as follows. The gate line driving circuit 105 is operated, with an ON signal being applied to the inspection pad 113*c* to turn ON the switch 113*a*, whereby a defect such as a line break can be detected based on the output of the inspection pad 113*b*.

Similarly, the source bus line 102 can be inspected as follows. The source line driving circuit 106 is operated with an appropriate signal being applied to a video signal line 108 and an ON signal being applied to the inspection pad 114*c* to turn ON the switch 114*a*, whereby a defect such as a line break can be detected based on the output of the inspection pad 114*b*.

With this inspection method, however, it is possible to inspect only the operation of the gate line driving circuit 105 and the source line driving circuit 106, and the condition of the gate bus line 101 and the source bus line 102. Since a large number of picture element transistors 104 are formed on an active matrix substrate, the production yield can be better improved by inspecting the condition of the picture element transistors 104.

A method for inspecting not only the condition of the driving circuit and the bus lines but also the condition of the picture element transistors is disclosed in, for example, Japanese Laid-Open Patent Publication No. 5-5866. With this method, data that has been written in each picture element storage capacitor is read out and checked. In this way, it is possible to inspect not only the condition of the driving circuit and the bus lines but also the condition of the picture element transistors, and any defective location can reliably be detected. The inspection method disclosed in this publication will now be described with reference to FIG. 16 and FIG. 17.

FIG. 16 illustrates an active matrix substrate with a built-in driving circuit, and FIG. 17 illustrates a system for inspecting a picture element defect in the active matrix substrate of FIG. 16. The gate line driving circuit 305 of the active matrix substrate 300 is operated while receiving external control signals via terminals 315. Similarly, a source line driving circuit 306 is operated while receiving external control signals via terminal 314.

First, the write method will be described. For example, the gate line driving circuit 305 selects a gate line 301*a* to turn ON a picture element transistor 304. Furthermore, a video signal from an external signal source 418 is output to a video line 308*a* via a selector switch 412 and a terminal 313*a* to turn ON an analog switch 307 of a source line 302*a* that is selected by a source line driving circuit 306, thereby writing the video signal to a storage capacitor 303 of the intended picture element. One electrode of each storage capacitor 303 that is away from the picture element transistor 304 is connected with others via a common electrode line 310, and in turn to an external common power supply via a common electrode terminal 312. Therefore, a charge corresponding to the difference between the voltage of the common power supply and that of the video signal is written to the storage capacitor 303.

Next, the read-out method will be described. The selector switch 412 of the external circuit is turned from the side of the signal source 418 to the side of an analog amplifier 413. The charge stored in the storage capacitor 303 of the picture element is read out to the outside of the panel as the picture element transistor 304 along the selected gate line is turned ON, and the analog switch 307 along the selected source line is turned ON. The charge read out to the outside of the panel is subjected to current-voltage conversion and to voltage amplification at the analog amplifier 413. Then, the analog signal is converted into a digital signal at an AD converter 414, and the obtained digital signal is subjected to signal processing by a PC 415. Thus, according to this method, data is actually written to each picture element for inspection, whereby it is possible not only to inspect the condition of the driving circuit and the bus lines but also to detect any defects in the picture element transistors on the active matrix substrate.

With this method, however, a video line that is used for writing data to a picture element needs to be used also for reading out the written data therefrom. Therefore, the inspection method requires a circuit that allows for reversible signal flow. Specifically, in a case where the driving force of the source line driving circuit is smaller than the load of the source line, e.g., with a large-sized panel or a high-definition panel, it is necessary to provide an amplifier 502 at the final output stage for outputting data to a source line, as illustrated in FIG. 18. Since an amplifier is not a circuit that allows for reversible signal flow, the data written to a picture element from a video line 501 cannot be read out therethrough.

Moreover, a digital driver as illustrated in FIG. 19 requires a DA converter 601 for converting a video digital signal into an analog voltage for liquid crystal display. However, the DA converter 601 is also not a circuit that allows for reversible signal flow, and cannot read out data that has been written to a picture element.

SUMMARY OF THE INVENTION

It is an object of the present invention to make it possible to inspect not only the condition of the driving circuit and the bus lines but also the condition of the picture element transistors by reading out and checking data that has been written to each picture element capacitor. Particularly, an object of the present invention is to make it possible to reliably detect any defective location in an active matrix substrate before it is assembled into a display panel.

An active matrix substrate according to a first aspect of the present invention includes: a plurality of transistors arranged in a lattice pattern on a substrate; a plurality of gate lines extending in parallel to one another and connected to respective gates of the plurality of transistors; a plurality of source lines extending in parallel to one another so as to cross the plurality of gate lines and connected to respective sources of the plurality of transistors; a gate line driving circuit for sending a scanning signal successively to the plurality of gate lines; a plurality of storage capacitors connected respectively to the plurality of transistors and to a common power supply; a source line driving circuit for successively selecting the plurality of source lines so as to send a video signal to the storage capacitors via the source lines being successively selected; and a read-out line for reading out charges stored in the plurality of storage capacitors via respective ones of the plurality of source lines, wherein: the read-out line is a single line shared by the plurality of source lines; and a plurality of switches are interposed between respective ones of the plurality of source lines and the source line driving circuit, each of the plurality of switches turning ON/OFF a connection between the source line and the source line driving circuit and turning ON/OFF a connection between the source line and the read-out line.

An active matrix substrate according to a second aspect of the present invention includes: a plurality of transistors arranged in a lattice pattern on a substrate; a plurality of gate lines extending in parallel to one another and connected to respective gates of the plurality of transistors; a plurality of source lines extending in parallel to one another so as to cross the plurality of gate lines and connected to respective sources of the plurality of transistors; a gate line driving circuit for sending a scanning signal successively to the plurality of gate lines; a plurality of storage capacitors connected respectively to the plurality of transistors and to a common power supply; a source line driving circuit for successively selecting the plurality of source lines so as to send a video signal to the storage capacitors via the source lines being successively selected; and a read-out line for reading out charges stored in the plurality of storage capacitors via respective ones of the plurality of source lines, wherein: the read-out line is a plurality of lines corresponding to the plurality of source lines, respectively; and a plurality of switches are interposed between respective ones of the plurality of source lines and the source line driving circuit, each of the plurality of switches turning ON/OFF a connection between the source line and the source line driving circuit and turning ON/OFF a connection between the source line and the read-out line.

In the active matrix substrate according to the first or second aspect of the present invention, it is preferred that the plurality of switches are arranged so that a period during which the connection between one of the source lines and the read-out line is turned ON does not overlap with a period during which the connection between another one of the source lines and the read-out line is turned ON. In such a case, the source line driving circuit may include a shift register circuit, and the plurality of switches may be controlled by using shift register outputs from the shift register circuit.

In the active matrix substrate according to the first or second aspect of the present invention, the source line driving circuit may be an analog source line driving circuit, and an amplifier may be interposed between the source line driving circuit and each of the plurality of switches. Alternatively, the source line driving circuit may be a digital source line driving circuit.

In the active matrix substrate according to the second aspect of the present invention, charges stored in the plurality of storage capacitors may be read out through the plurality of read-out lines simultaneously, or may alternatively be read out through the plurality of read-out lines while using one read-out line at a time by time-division multiplexing.

A method for producing an active matrix substrate of the present invention includes the steps of: reading out charges stored in the plurality of storage capacitors of the active matrix substrate according to the first or second aspect of the present invention; and analyzing data of the read-out charges to inspect the active matrix substrate.

An image display device of the present invention includes: the active matrix substrate according to the first or second aspect of the present invention including a plurality of picture element electrodes connected to the plurality of transistors, respectively; a counter electrode opposing the active matrix substrate; and a display medium layer interposed between the picture element electrodes and the counter electrode. The display medium layer may be a light modulating layer capable of changing the transmittance for ambient light that is incident thereon, such as a liquid crystal layer, or may alternatively be a layer made of an inorganic or organic EL (Electro Luminescence) material, which emits light by itself.

With the active matrix substrate of the present invention, it is possible to inspect not only the condition of the driving circuit and the bus lines but also the condition of the picture element transistors, and any defective location can reliably be detected. Specifically, by reading out a charge stored in the storage capacitor of each picture element of the active matrix substrate, it is possible to detect various types of defects, including: a defective source line driving circuit; a defective gate line driving circuit; a source line break; leakage between a source line and an adjacent source line, a gate line, a common electrode line or a picture element electrode; leakage between a gate line and an adjacent gate line, a common electrode line or a picture element electrode; an ON defect of a picture element transistor; an OFF defect of a picture element transistor; leakage between upper and lower electrodes of a storage capacitor, a defective analog switch, and the like.

DETAILED DESCRIPTION OF THE PREFERRED EMBODIMENTS

Figure 1:
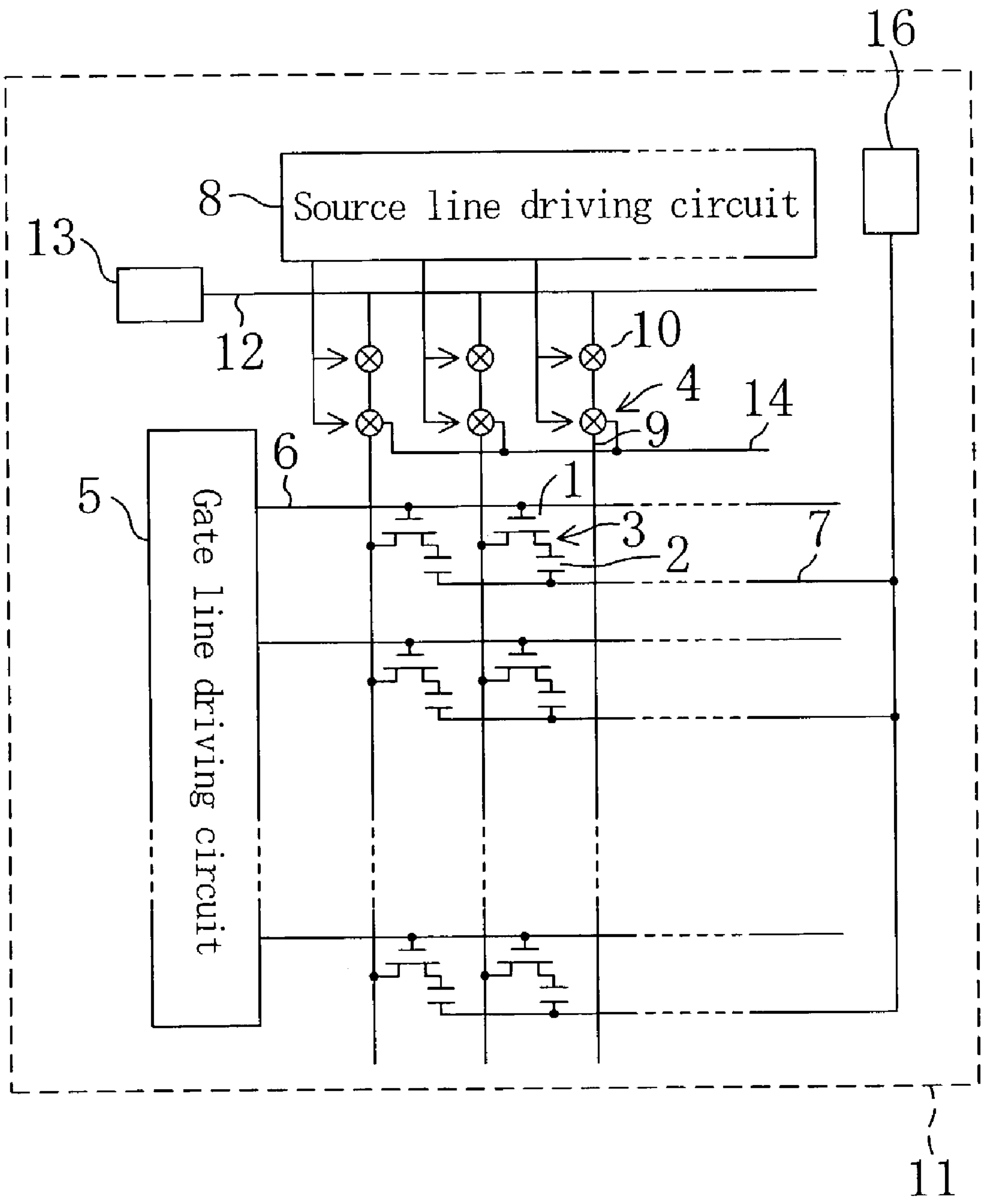
FIG. 1 is a block diagram illustrating an active matrix substrate of Embodiment 1.

Preferred embodiments of the present invention will now be described with reference to the drawings. Note that while the following embodiments will be directed to active matrix substrates for use in a liquid crystal display device, the active matrix substrate of the present invention may alternatively be used in an organic or inorganic EL (electroluminescent) display device, a plasma display device, an electrochromic display device, or the like. Also note that a group of reference numerals may be herein referred to collectively. For example, 705*a*, 705*b*, 705*c*, . . . , may be referred to collectively as "705", or 904*a*1, 904*a*2, 904*a*3, . . . , as "904*a*".

Embodiment 1

In the present embodiment, an active matrix substrate according to the first aspect of the present invention will be described. FIG. 1 is a block diagram illustrating an active matrix substrate of the present embodiment. The active matrix substrate of the present embodiment is an active matrix substrate with a built-in driving circuit, wherein a source line driving circuit is an analog driver.

The active matrix substrate of the present embodiment includes a plurality of pixel sections 3 arranged in a lattice pattern on a substrate 11, e.g., a glass substrate, a quartz substrate or a semiconductor substrate. Each pixel section 3 includes a picture element transistor 1 and a storage capacitor 2 connected to the picture element transistor 1 for storing a charge. One electrode of each storage capacitor 2 that is away from the picture element transistor 1 is connected to one of a plurality of common electrode lines 7 to which the storage capacitor 2 is connected. The common electrode lines 7 extend in parallel to gate lines 6. The common electrode lines 7 are connected to a common electrode terminal 16, which is in turn connected to an external common power supply. Note that each pixel section 3 includes a plurality of picture element electrodes (not shown), which are connected to the picture element transistor 1.

On the substrate 11, the gate lines 6 extend in parallel to one another, and source lines 9 extend in parallel to one another so as to cross the gate lines 6. In the present embodiment, the gate lines 6 extend in the row direction, and the source lines 9 extend in the column direction. The gates of the picture element transistors 1 along each row are commonly connected to the gate line 6 of that row, and the sources of the picture element transistors 1 along each column are commonly connected to the source line 9 of that column. The gate lines 6 are connected to a gate line driving circuit 5, which sends a scanning signal successively to the gate lines 6.

The source lines 9 are connected to a video signal line 12 each via an analog switch 10 and a read-out switch 4, which are turned ON/OFF by a source line driving circuit 8. The source line 9 selected by the source line driving circuit 8 is connected to the video signal line 12 when the analog switch 10 along the selected source line 9 is turned ON and the read-out switch 4 therealong is turned OFF. Moreover, the source line 9 selected by the source line driving circuit 8 is connected to a read-out line 14 when the analog switch 10 along the selected source line 9 is turned OFF and the read-out switch 4 therealong is turned ON. The read-out line 14 is a single line shared by the plurality of the source lines 9. Note that the gate line driving circuit 5 and the source line driving circuit 8 are each operated by receiving an external control signal.

Figure 2:
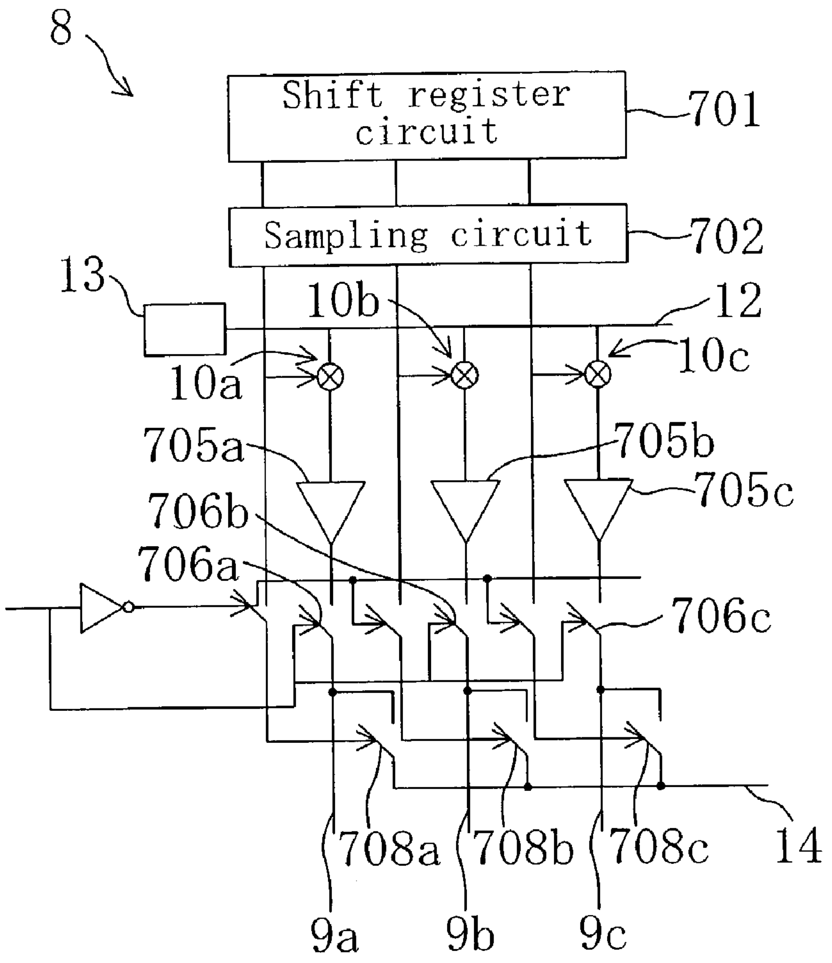
FIG. 2 is a block diagram illustrating an enlarged view of a portion of the active matrix substrate of Embodiment 1 around a source line driving circuit 8.

FIG. 2 is a block diagram illustrating an enlarged view of a portion of the active matrix substrate illustrated in FIG. 1 around the source line driving circuit 8. The active matrix substrate of the present embodiment can be inspected by writing data to the storage capacitor of each picture element and then reading out and analyzing the stored data. The write operation will now be described with reference to FIG. 1 and FIG. 2.

The source line driving circuit 8 includes a shift register circuit 701 and a sampling circuit 702. During a write operation, analog switches 10*a*, 10*b* and 10*c* are successively turned ON by using sampling pulses produced by the shift register circuit 701 and the sampling circuit 702. Writing data (a video signal), which has been input to a terminal 13 from an external signal source (not shown), passes through the video signal line (video line) 12 and the analog switches 10*a*, 10*b* and 10*c* into amplifiers 705*a*, 705*b* and 705*c*. Note that the amplifiers 705*a*, 705*b* and 705*c* are provided for current amplification since the source line 9 having a large load cannot be charged with the original writing data. In the amplifiers 705*a*, 705*b* and 705*c*, the signal flow is irreversible.

During a write operation, source lines 9*a*, 9*b* and 9*c* are charged with the data voltage by simultaneously or successively turning ON first switches 706*a*, 706*b* and 706*c* while turning OFF second switches 708*a*, 708*b* and 708*c*. When the picture element transistors 1 that are connected to the gate line 6 selected by the gate line driving circuit 5 are turned ON, the data voltage is written to the storage capacitors 2 of the picture elements from the source lines 9*a*, 9*b* and 9*c* via the picture element transistors 1. Since the electrode of each storage capacitor 2 that is away from the picture element transistor 1 is connected to the external common power supply (not shown) via the common electrode line 7, a charge corresponding to the difference between the voltage of the common power supply and that of the video signal is written to the storage capacitor 2. For the purpose of inspection, data to be written is preferably constant data in view of the defect-detecting efficiency, and the data to be written may be, for example, the maximum writing voltage.

Next, the read operation for reading out the writing data will be described. During a read operation, the first switches 706*a*, 706*b* and 706*c* are turned OFF so as to disconnect the amplifiers 705*a*, 705*b* and 705*c* from the source lines 9*a*, 9*b* and 9*c*, respectively. The charges stored in the storage capacitors 2 of the picture elements that are connected to the gate line 6 selected by the gate line driving circuit 5 are read out through the source lines 9*a*, 9*b* and 9*c* via the respective picture element transistors 1 being turned ON.

The second switches 708*a*, 708*b* and 708*c* are not turned ON simultaneously but are turned ON successively in a sequence of 708*a*, 708*b*, 708*c*, . . . . As the second switches 708*a*, 708*b* and 708*c* are turned ON successively, the charges stored in the picture elements along the gate line 6 can be successively read out to the read-out line 14 via the source lines 9*a*, 9*b* and 9*c*.

Figure 3:
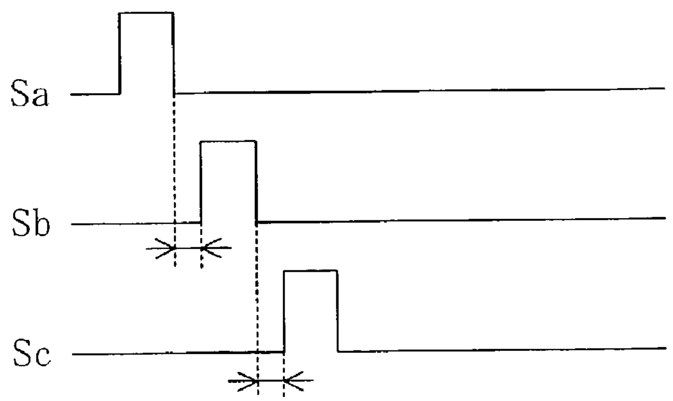
FIG. 3 is a timing chart illustrating signals for controlling second switches 708*a*, 708*b* and 708*c* that are connected to a single read-out line 14 in Embodiment 1.

FIG. 3 illustrates an example of a set of signals for controlling the second switches 708*a*, 708*b* and 708*c*. If the second switches 708*a*, 708*b* and 708*c* are turned ON simultaneously, the read-out signals are mixed together on the read-out line 14, thereby failing to perform a proper inspection. In view of this, signals Sa to Sc are controlled so that adjacent two of the signals, i.e., Sa and Sb, or Sb and Sc, will not be ON at the same time. While the sampling pulses output from the sampling circuit 702 of the source line driving circuit 8 are used as the signals for controlling the second switches 708*a*, 708*b* and 708*c* in the present embodiment, external control signals may alternatively be used. Moreover, the reading speed does not need to be equal to the writing speed. For example, if there is a speed-limiting factor in the reading system, the reading speed may be lower.

The charges of the storage capacitors 2 of the picture elements, which are successively read out to the read-out line 14, are amplified by an external analog amplifier (not shown), converted by an AD converter (not shown) into a digital signal, and processed by a PC (personal computer).

In the present embodiment, the read-out line 14, and the first and second switches 706 and 708 are provided on the same side of the pixel area as the source line driving circuit 8, for the following reason. In order to drive an active matrix display device, it is necessary to provide, in addition to the gate line driving circuit 5 and the source line driving circuit 8, a precharge circuit for assisting the source line driving circuit 8 in writing data to pixels. The precharge circuit is provided on the opposite side of the pixel area from the source line driving circuit 8.

Moreover, the precharge circuit cannot be used for inspection. For example, in a precharge circuit disclosed in Japanese Laid-Open Patent Publication No. 7-295521, switches PSW used for precharging respective source bus lines are controlled by a single signal PCG, which is shared by all source bus lines. Therefore, it is not possible to select one source bus line separately from the others, whereby data cannot be read out pixel by pixel. In view of this, the read-out line 14 and the first and second switches 706 and 708 are provided on the same side as the source line driving circuit 8, where the switches for writing data to the source bus lines can be controlled independently.

According to the present embodiment, even if the amplifier 705 is provided in the source line driving circuit 8 at the output stage for outputting data to the source line 9, i.e., even if the signal flow is irreversible in the source line driving circuit 8, the charges stored in the storage capacitors of the picture elements of the active matrix substrate can be read out, whereby the active matrix substrate can be inspected. Therefore, it is possible to increase the production efficiency and to reduce the production cost by not passing defective substrates to subsequent production steps.

Note that the configuration used in the write operation of the analog source line driving circuit 8 is not limited to that of the present embodiment, but may alternatively be any other suitable configuration.

Embodiment 2

In the present embodiment, an active matrix substrate according to the second aspect of the present invention will be described. The active matrix substrate of the present embodiment is an active matrix substrate with a built-in driving circuit, wherein the source line driving circuit is an analog driver. Note that the active matrix section is similar to that in Embodiment 1, and will not be further described below.

Figure 4:
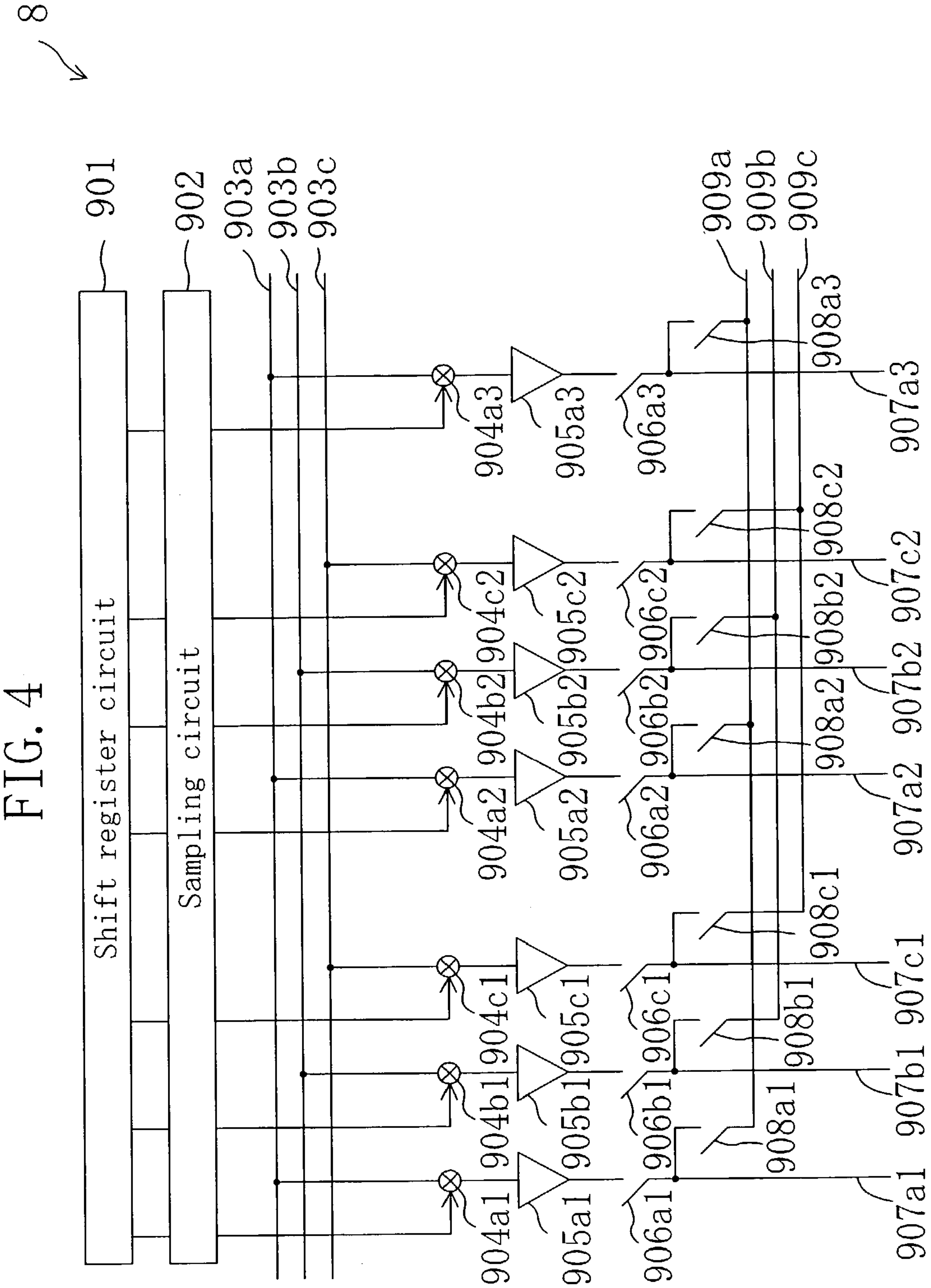
FIG. 4 is a block diagram illustrating an enlarged view of a portion of an active matrix substrate of Embodiment 2 around a source line driving circuit 8.

FIG. 4 is a block diagram illustrating an enlarged view of a portion of the active matrix substrate of the present embodiment around the source line driving circuit 8. In the active matrix substrate of the present embodiment, a number of (three) video signal lines (video lines), and a number of (three) read-out lines are provided for R, G and B pixels, respectively.

In the active matrix substrate of the present embodiment, data is first written to the storage capacitor of each picture element, and then the stored data is read out and analyzed for inspecting the active matrix substrate, as in Embodiment 1. The write operation will be described with reference to FIG. 1 and FIG. 4.

The source line driving circuit 8 includes a shift register circuit 901 and a sampling circuit 902. During a write operation, analog switches **904*a*1, 904*b*1, 904*c*1, 904*a*2, 904*b*2, 904*c*2, 904*a*3, . . . , are turned ON, for example, simultaneously, by using sampling pulses produced by the shift register circuit 901 and the sampling circuit 902**.

R, G and B writing data pass through video signal lines (video lines) **903*a*, 903*b* and 903*c* and the analog switches 904*a*, 904*b* and 904*c* into amplifiers 905*a*, 905*b* and 905*c*, respectively. Note that the amplifiers 905*a*, 905*b* and 905*c* are provided for current amplification since the source lines 907*a*, 907*b* and 907*c* having a large load cannot be charged with the original writing data. In the amplifiers 905*a*, 905*b* and 905*c*,** the signal flow is irreversible.

During a write operation, the source lines **907*a*, 907*b* and 907*c* are charged with the data voltage by simultaneously or successively turning ON first switches 906*a*, 906*b* and 906*c* while turning OFF second switches 908*a*, 908*b* and 908*c*. When the picture element transistors 1 that are connected to the gate line 6 selected by the gate line driving circuit 5 are turned ON, the data voltage is written to the storage capacitors 2 of the picture elements from the source lines 907*a*, 907*b* and 907*c* via the picture element transistors 1. A charge corresponding to the difference between the voltage of the common power supply and that of the video signal is written to the storage capacitor 2**. For the purpose of inspection, data to be written is preferably constant data in view of the defect-detecting efficiency, and the data to be written may be, for example, the maximum writing voltage.

Next, the read operation for reading out the writing data will be described. During a read operation, the first switches **906*a*, 906*b* and 906*c* are turned OFF so as to disconnect the amplifiers 905*a*, 905*b* and 905*c* from the source lines 907*a*, 907*b* and 907*c*, respectively. The charges stored in the storage capacitors 2 of the picture elements that are connected to the gate line 6 selected by the gate line driving circuit 5 are read out through the source lines 907*a*, 907*b* and 907*c* via the respective picture element transistors 1** being turned ON.

Second switches **908*a*1, 908*a*2, 908*a*3, . . . , that are connected to one of a plurality of read-out lines 909*a*, 909*b* and 909*c*, e.g., the read-out line 909*a*, are not turned ON simultaneously but are turned ON successively in a sequence of 908*a*1, 908*a*2, 908*a*3, . . . As the second switches 908*a*1, 908*a*2, 908*a*3, . . . , connected to the read-out line 909*a* are turned ON successively, the charges stored in the picture elements along the gate line 6 can be read out successively to the read-out line 909*a* via the source lines 907*a*1, 907*a*2, 907*a*3**, . . . .

Figure 5:
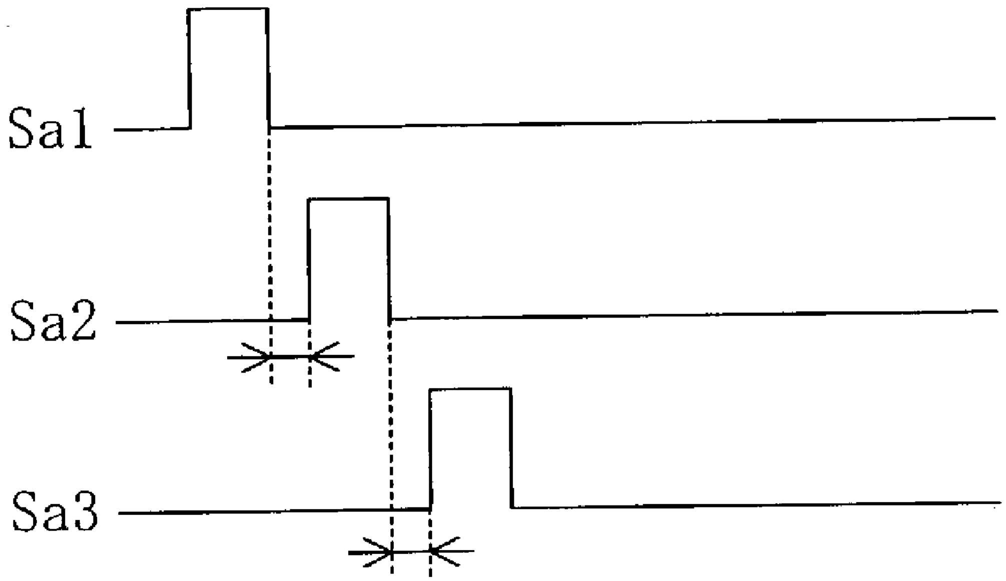
FIG. 5 is a timing chart illustrating signals for controlling second switches 908*a*1, 908*a*2 and 908*a*3 that are connected to a read-out line 909*a* in Embodiment 2.

FIG. 5 illustrates an example of a set of signals for controlling the second switches **908*a*1, 908*a*2 and 908*a*3 that are connected to one of the plurality of read-out lines 909*a*, 909*b* and 909*c*, e.g., the read-out line 909*a*. If the second switches 908*a*1, 908*a*2 and 908*a*3 are turned ON simultaneously, the read-out signals are mixed together on the read-out line 909*a*, thereby failing to perform a proper inspection. In view of this, signals Sa1 to Sa3 are controlled so that adjacent two of the signals, i.e., Sa1 and Sa2, or Sa2 and Sa3**, will not be ON at the same time.

The read-out lines **909*a*, 909*b* and 909*c* can control the second switches 908*a*, 908*b* and 908*c*, respectively, and independently of one another. For example, the second switch 908*a*1 connected to the read-out line 909*a*, the second switch 908*b*1 connected to the read-out line 909*b*, and the second switch 908*c*1 connected to the read-out line 909*c* may be turned ON simultaneously. The signals for controlling the second switches 908*a*, 908*b* and 908*c* may be the sampling pulses output from the sampling circuit 902 of the source line driving circuit 8**, or may alternatively be external signals. Moreover, the reading speed does not need to be equal to the writing speed. For example, if there is a speed-limiting factor in the reading system, the reading speed may be lower.

In the present embodiment, a plurality of read-out lines (**909*a*, 909*b* and 909*c*) are provided. Therefore, the three read-out lines 909*a*, 909*b* and 909*c* can be read out simultaneously, or the read-out lines 909*a*, 909*b* and 909*c* may alternatively be read out one at a time, e.g., in a sequence of 909*a*, 909*b* and 909*c*.** While three read-out lines are provided in the present embodiment, the number of read-out lines to be provided is not limited thereto.

The charges of the storage capacitors 2 of the picture elements, which have been read out to the read-out lines **909*a*, 909*b* and 909*c*, are amplified by an external analog amplifier (not shown), converted by an AD converter (not shown) into a digital signal, and processed by a PC (personal computer). In the present embodiment, a plurality of read-out lines (909*a*, 909*b* and 909*c*) are provided. Therefore, in order to read out data from a plurality of lines simultaneously, there are required a plurality of external analog amplifiers and a plurality of AD converters. Alternatively, data can be read out through the plurality of read-out lines 909***a,* 909*b* and 909*c* while using one read-out line at a time by time-division multiplexing. In such a case, it is not always necessary to provide a plurality of external analog amplifiers and a plurality of AD converters, and it is possible to reduce the number of circuits required for reading out data.

According to the present embodiment, even if the amplifier 905 is provided in the source line driving circuit 8 at the output stage for outputting date to the source line 907, i.e., even if the signal flow is irreversible in the source line driving circuit 8, the charges stored in the storage capacitors of the picture elements of the active matrix substrate can be read out, whereby the active matrix substrate can be inspected. Therefore, it is possible to increase the production efficiency and to reduce the production cost by not passing defective substrates to subsequent production steps. Furthermore, in the present embodiment, a plurality of read-out lines (909*a,* 909*b* and 909*c*) are provided. Therefore, the inspection time can be further reduced when data are read out through a plurality of lines simultaneously.

Note that the configuration used in the write operation of the analog source line driving circuit 8 is not limited to that of the present embodiment, but may alternatively be any other suitable configuration.

Embodiment 3

In the present embodiment, an active matrix substrate according to the first aspect of the present invention will be described. The active matrix substrate of the present embodiment is an active matrix substrate with a built-in driving circuit, wherein the source line driving circuit is a digital driver. Note that the active matrix section is similar to that in Embodiment 1, and will not be further described below.

Figure 6:
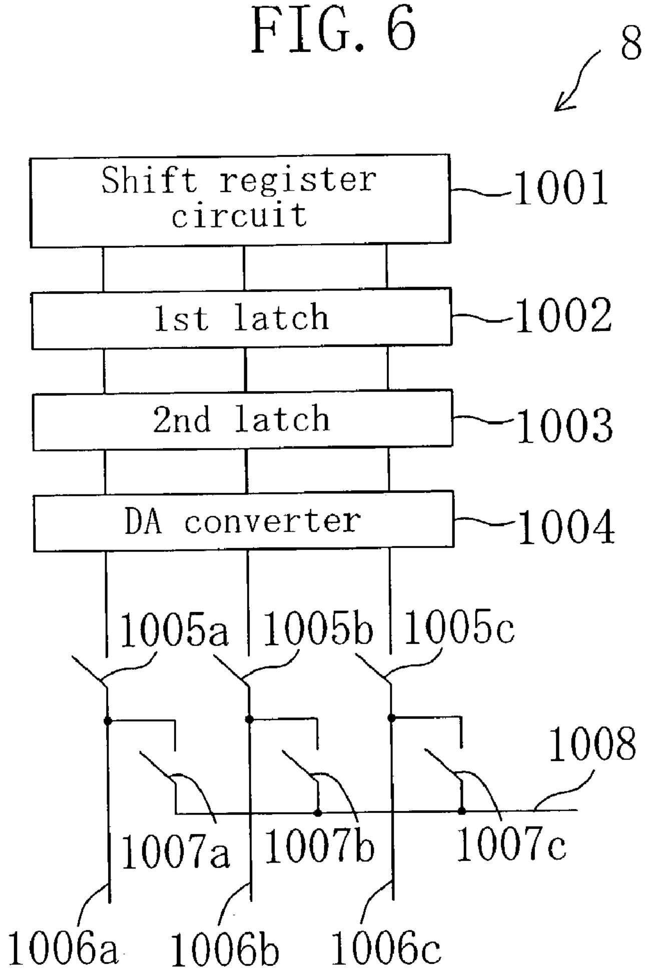
FIG. 6 is a block diagram illustrating an enlarged view of a portion of an active matrix substrate of Embodiment 3 around a source line driving circuit 8.

FIG. 6 is a block diagram illustrating an enlarged view of a portion of the active matrix substrate of the present embodiment around the source line driving circuit 8. In the active matrix substrate of the present embodiment, data is first written to the storage capacitor of each picture element, and then the stored data is read out and analyzed for inspecting the active matrix substrate, as in Embodiment 1. The write operation will be described with reference to FIG. 1 and FIG. 6.

The source line driving circuit 8 includes a shift register circuit 1001, a 1st latch circuit 1002, a 2nd latch circuit 1003 and a DA converter 1004. During a write operation, digital data is latched by the 1st latch circuit 1002 according to the output of the shift register circuit 1001. After latching all data for one horizontal line, the data is transferred to the 2nd latch circuit 1003, and the 1st latch circuit 1002 starts latching data for the next horizontal line. The digital data latched by the 2nd latch circuit 1003 is converted by the DA converter 1004 into analog data needed for active matrix driving. The DA converter 1004 may be a DA converter of a resistance-division type or a capacitance-division type, in both of which the signal flow is irreversible. A DA converter of either type can be used with the present invention.

During a write operation, source lines 1006*a,* 1006*b* and 1006*c* are charged with the data voltage by simultaneously or successively turning ON first switches 1005*a,* 1005*b* and 1005*c* while turning OFF second switches 1007*a,* 1007*b* and 1007*c*. When the picture element transistors 1 that are connected to the gate line 6 selected by the gate line driving circuit 5 are turned ON, the data voltage is written to the storage capacitors 2 of the picture elements from the source lines 1006*a,* 1006*b* and 1006*c* via the picture element transistors 1. A charge corresponding to the difference between the voltage of the common power supply and that of the video signal is written to the storage capacitor 2. For the purpose of inspection, data to be written is preferably constant data in view of the defect-detecting efficiency, and the data to be written may be, for example, the maximum writing voltage.

Next, the read operation for reading out the writing data will be described. During a read operation, the first switches 1005*a,* 1005*b* and 1005*c* are turned OFF so as to disconnect the DA converter 1004 from the source lines 1006*a,* 1006*b* and 1006*c*. The charges stored in the storage capacitors 2 of the picture elements that are connected to the gate line 6 selected by the gate line driving circuit 5 are read out through the source lines 1006*a,* 1006*b* and 1006*c* via the respective picture element transistors 1 being turned ON.

Second switches 1007*a,* 1007*b* and 1007*c* that are connected to a read-out line 1008 are not turned ON simultaneously but are turned ON successively in a sequence of 1007*a,* 1007*b,* 1007*c,* . . . . As the second switches 1007*a,* 1007*b* and 1007*c* are turned ON successively, the charges stored in the picture elements along the gate line 6 can be read out successively to the read-out line 1008 via the source lines 1006*a,* 1006*b* and 1006*c*.

Figure 7:
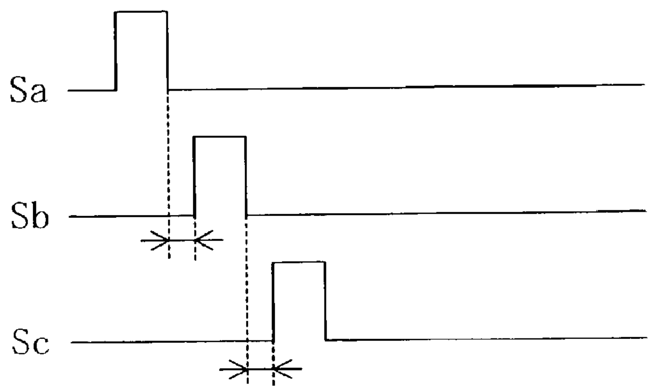
FIG. 7 is a timing chart illustrating signals for controlling second switches 1007*a*, 1007*b* and 1007*c* that are connected to a single read-out line 1008 in Embodiment 3.

FIG. 7 illustrates an example of a set of signals for controlling the second switches 1007*a,* 1007*b* and 1007*c*. If the second switches 1007*a,* 1007*b* and 1007*c* are turned ON simultaneously, the read-out signals are mixed together on the read-out line 1008, thereby failing to perform a proper inspection. In view of this, signals Sa to Sc are controlled so that adjacent two of the signals, i.e., Sa and Sb, or Sb and Sc, will not be ON at the same time. The signals for controlling the second switches 1007*a,* 1007*b* and 1007*c* may be the output signals from the shift register, which are signals for latching data of the source line driving circuit 8 by the 1st latch circuit 1002, or may alternatively be external signals. Moreover, the reading speed does not need to be equal to the writing speed. For example, if there is a speed-limiting factor in the reading system, the reading speed may be lower.

The charges of the storage capacitors 2 of the picture elements, which are successively read out to the read-out line 1008, are amplified by an external analog amplifier (not shown), converted by an AD converter (not shown) into a digital signal, and processed by a PC (personal computer).

According to the present embodiment, even if the DA converter 1004 is provided in the digital driving circuit at the output stage for outputting date to the source line 1006, i.e., even if the signal flow is irreversible in the source line driving circuit 8, the charges stored in the storage capacitors of the picture elements of the active matrix substrate can be read out, whereby the active matrix substrate can be inspected. Therefore, it is possible to increase the production efficiency and to reduce the production cost by not passing defective substrates to subsequent production steps.

Note that the configuration used in the write operation of the digital source line driving circuit 8 is not limited to that of the present embodiment, but may alternatively be any other suitable configuration.

Embodiment 4

In the present embodiment, an active matrix substrate according to the first aspect of the present invention will be described. The active matrix substrate of the present embodiment is an active matrix substrate with a built-in driving circuit, and the source line driving circuit is a digital driver, with an amplifier circuit provided at the output stage.

Note that the active matrix section is similar to that in Embodiment 1, and will not be further described below.

Figure 8:
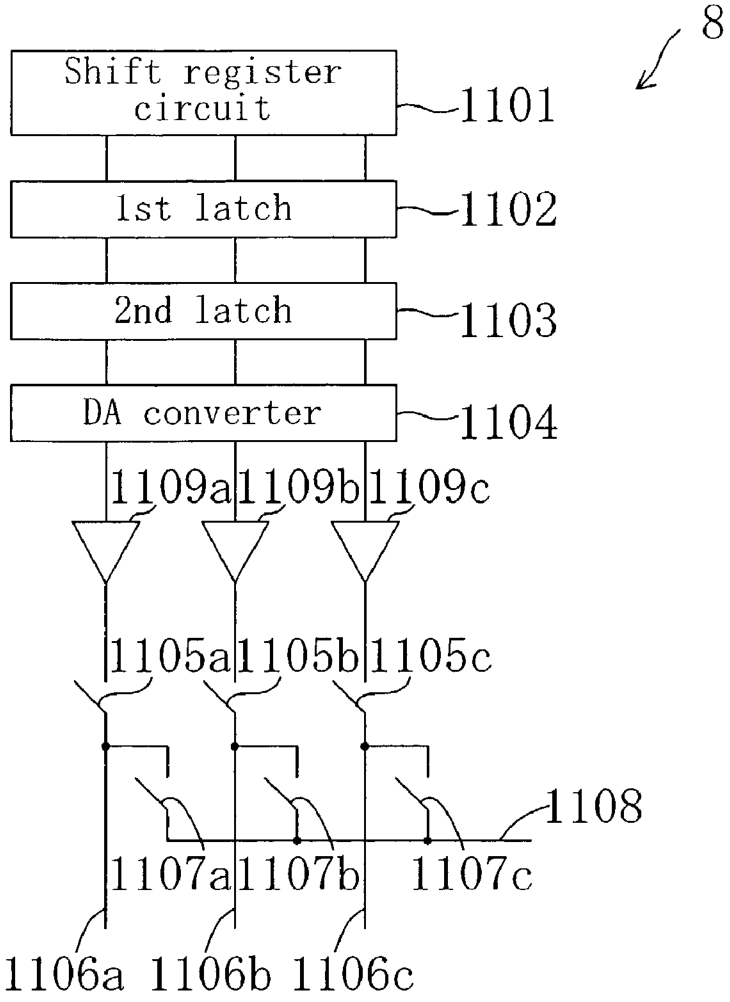
FIG. 8 is a block diagram illustrating an enlarged view of a portion of an active matrix substrate of Embodiment 4 around a source line driving circuit 8.

FIG. 8 is a block diagram illustrating an enlarged view of a portion of the active matrix substrate of the present embodiment around the source line driving circuit 8. In the active matrix substrate of the present embodiment, data is first written to the storage capacitor of each picture element, and then the stored data is read out and analyzed for inspecting the active matrix substrate, as in Embodiment 1. The write operation will be described with reference to FIG. 1 and FIG. 8.

The source line driving circuit 8 includes a shift register circuit 1101, a 1st latch circuit 1102, a 2nd latch circuit 1103 and a DA converter 1104. During a write operation, digital data is latched by the 1st latch circuit 1102 according to the output of the shift register circuit 1101. After latching all data for one horizontal line, the data is transferred to the 2nd latch circuit 1103, and the 1st latch circuit 1102 starts latching data for the next horizontal line. The digital data latched by the 2nd latch circuit 1103 is converted by the DA converter 1104 into analog data needed for active matrix driving. The DA converter 1104 may be a DA converter of a resistance-division type or a capacitance-division type, either of which can be used with the present invention. The output of DA converter 1104 is sent to the amplifier 1109. Note that the amplifiers 1109*a*, 1109*b* and 1109*c* are provided for current amplification since the source lines 1106*a*, 1106*b* and 1106*c* having a large load cannot be charged with the original writing data. In the amplifiers 1109*a*, 1109*b* and 1109*c*, the signal flow is irreversible.

During a write operation, the source lines 1106*a*, 1106*b* and 1106*c* are charged with the data voltage by simultaneously or successively turning ON first switches 1105*a*, 1105*b* and 1105*c* while turning OFF second switches 1107*a*, 1107*b* and 1107*c*. When the picture element transistors 1 that are connected to the gate line 6 selected by the gate line driving circuit 5 are turned ON, the data voltage is written to the storage capacitors 2 of the picture elements from the source lines 1106*a*, 1106*b* and 1106*c* via the picture element transistors 1. A charge corresponding to the difference between the voltage of the common power supply and that of the video signal is written to the storage capacitor 2. For the purpose of inspection, data to be written is preferably constant data in view of the defect-detecting efficiency, and the data to be written may be, for example, the maximum writing voltage.

Next, the read operation for reading out the writing data will be described. During a read operation, the first switches 1105*a*, 1105*b* and 1105*c* are turned OFF so as to disconnect the amplifiers 1109*a*, 1109*b* and 1109*c* from the source lines 1106*a*, 1106*b* and 1106*c*, respectively. The charges stored in the storage capacitors 2 of the picture elements that are connected to the gate line 6 selected by the gate line driving circuit 5 are read out through the source lines 1106*a*, 1106*b* and 1106*c* via the respective picture element transistors 1 being turned ON.

Second switches 1107*a*, 1107*b* and 1107*c* that are connected to a read-out line 1108 are not turned ON simultaneously but are turned ON successively in a sequence of 1107*a*, 1107*b*, 1107*c*, . . . . As the second switches 1107*a*, 1107*b* and 1107*c* are turned ON successively, the charges stored in the picture elements along the gate line 6 can be read out successively to the read-out line 1108 via the source lines 1106*a*, 1106*b* and 1106*c*.

Figure 9:
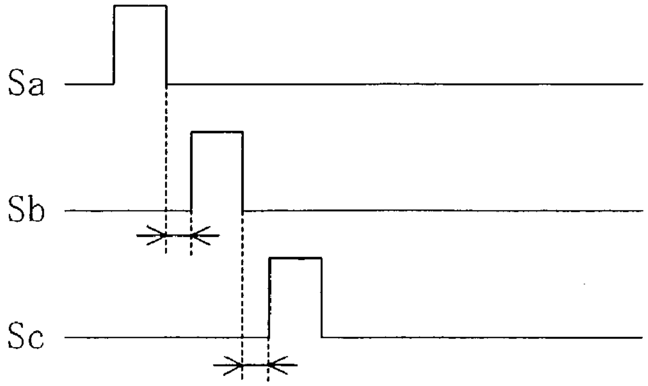
FIG. 9 is a timing chart illustrating signals for controlling second switches 1107*a*, 1107*b* and 1107*c* that are connected to a single read-out line 1108 in Embodiment 4.

FIG. 9 illustrates an example of a set of signals for controlling the second switches 1107*a*, 1107*b* and 1107*c*. If the second switches 1107*a*, 1107*b* and 1107*c* are turned ON simultaneously, the read-out signals are mixed together on the read-out line 1108, thereby failing to perform a proper inspection. In view of this, signals S1 to S3 are controlled so that adjacent two of the signals, i.e., S1 and S2, or S2 and S3, will not be ON at the same time. The signals for controlling the second switches 1107*a*, 1107*b* and 1107*c* may be the output signals from the shift register, which are signals for latching data of the source line driving circuit 8 by the 1st latch circuit 1102, or may alternatively be external signals. Moreover, the reading speed does not need to be equal to the writing speed. For example, if there is a speed-limiting factor in the reading system, the reading speed may be lower.

The charges of the storage capacitors 2 of the picture elements, which are successively read out to the read-out line 1108, are amplified by an external analog amplifier (not shown), converted by an AD converter (not shown) into a digital signal, and processed by a PC (personal computer).

According to the present embodiment, even if the amplifier 1109 is provided in the digital driving circuit at the output stage for outputting date to the source line 1106, i.e., even if the signal flow is irreversible in the source line driving circuit 8, the charges stored in the storage capacitors of the picture elements of the active matrix substrate can be read out, whereby the active matrix substrate can be inspected. Therefore, it is possible to increase the production efficiency and to reduce the production cost by not passing defective substrates to subsequent production steps.

Note that the configuration used in the write operation of the digital source line driving circuit 8 is not limited to that of the present embodiment, but may alternatively be any other suitable configuration.

Embodiment 5

In the present embodiment, an active matrix substrate according to the second aspect of the present invention will be described. The active matrix substrate of the present embodiment is an active matrix substrate with a built-in driving circuit, wherein the source line driving circuit is a digital driver. Note that the active matrix section is similar to that in Embodiment 1, and will not be further described below.

Figure 10:
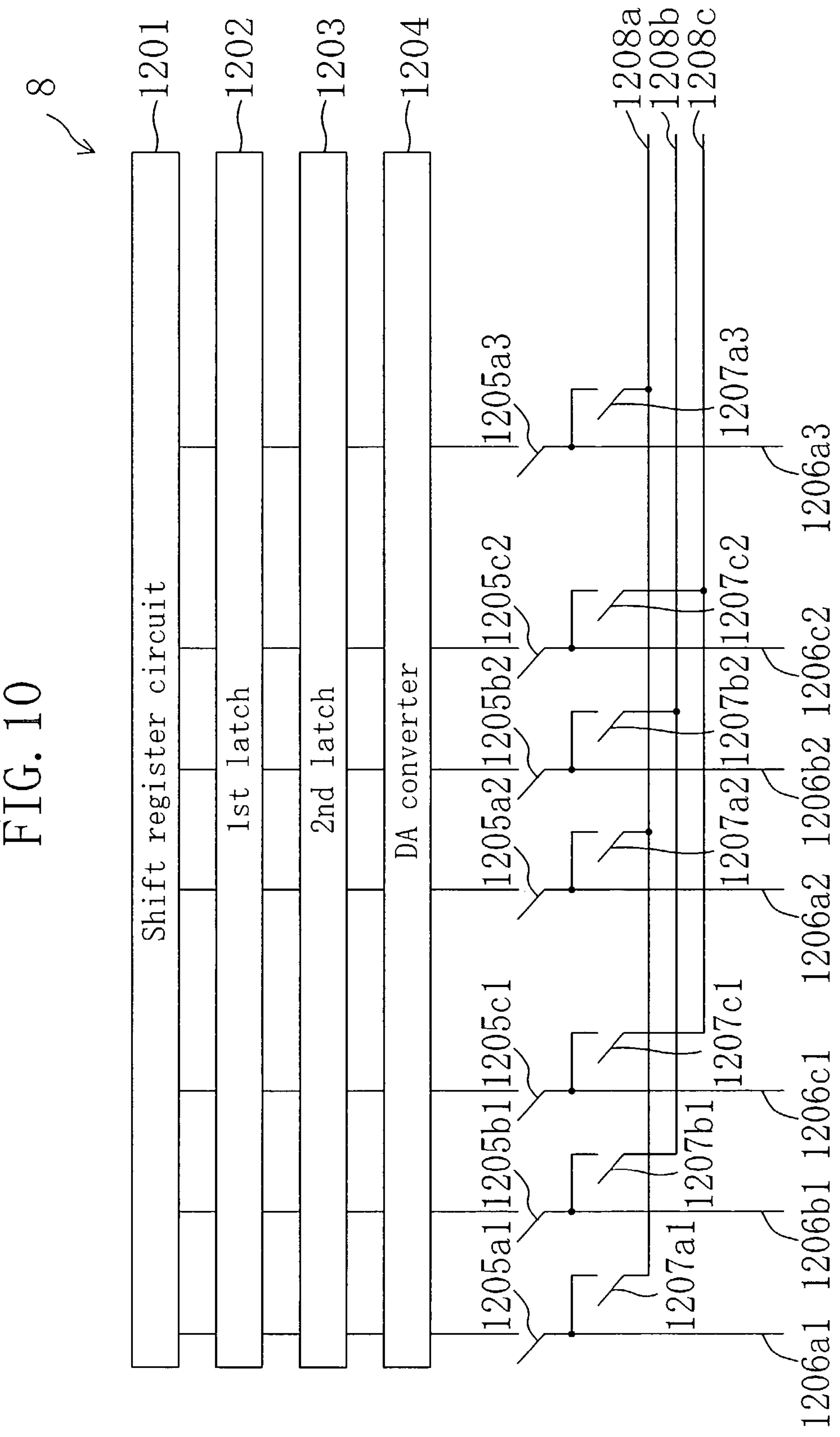
FIG. 10 is a block diagram illustrating an enlarged view of a portion of an active matrix substrate of Embodiment 5 around the source line driving circuit 8.

FIG. 10 is a block diagram illustrating an enlarged view of a portion of the active matrix substrate of the present embodiment around the source line driving circuit 8. In the active matrix substrate of the present embodiment, data is first written to the storage capacitor of each picture element, and then the stored data is read out and analyzed for inspecting the active matrix substrate, as in Embodiment 1. The write operation will be described with reference to FIG. 1 and FIG. 10.

The source line driving circuit 8 includes a shift register circuit 1201, a 1st latch circuit 1202, a 2nd latch circuit 1203 and a DA converter 1204. During a write operation, digital data is latched by the 1st latch circuit 1202 according to the output of the shift register circuit 1201. After latching all data for one horizontal line, the data is transferred to the 2nd latch circuit 1203, and the 1st latch circuit 1202 starts latching data for the next horizontal line. The digital data latched by the 2nd latch circuit 1203 is converted by the DA converter 1204 into analog data needed for active matrix driving. The DA converter 1204 may be a DA converter of a resistance-division type or a capacitance-division type, in both of which the signal flow is irreversible. A DA converter of either type can be used with the present invention.

During a write operation, source lines 1206*a*, 1206*b* and 1206*c* are charged with the data voltage by simultaneously or successively turning ON first switches 1205*a*, 1205*b* and 1205*c* while turning OFF second switches 1207*a*, 1207*b* and 1207*c*. When the picture element transistors 1 that are connected to the gate line 6 selected by the gate line driving circuit 5 are turned ON, the data voltage is written to the storage capacitors 2 of the picture elements from the source lines 1206*a*, 1206*b* and 1206*c* via the picture element transistors 1. A charge corresponding to the difference between the voltage of the common power supply and that of the video signal is written to the storage capacitor 2. For the purpose of inspection, data to be written is preferably constant data in view of the defect-detecting efficiency, and the data to be written may be, for example, the maximum writing voltage.

Next, the read operation for reading out the writing data will be described. During a read operation, the first switches 1205*a*, 1205*b* and 1205*c* are turned OFF so as to disconnect the DA converter 1204 from the source lines 1206*a*, 1206*b* and 1206*c*. The charges stored in the storage capacitors 2 of the picture elements that are connected to the gate line 6 selected by the gate line driving circuit 5 are read out through the source lines 1206*a*, 1206*b* and 1206*c* via the respective picture element transistors 1 being turned ON.

Second switches 1207*a*1, 1207*a*2, 1207*a*3, . . . , that are connected to one of a plurality of read-out lines 1208*a*, 1208*b* and 1208*c*, e.g., the read-out line 1208*a*, are not turned ON simultaneously but are turned ON successively in a sequence of 1207*a*1, 1207*a*2, 1207*a*3, . . . . As the second switches 1207*a*1, 1207*a*2, 1207*a*3, . . . , connected to the read-out line 1208*a* are turned ON successively, the charges stored in the picture elements along the gate line 6 can be read out successively to the read-out line 1208*a* via the source lines 1206*a*1, 1206*a*2, 1206*a*3, . . . .

Figure 11:
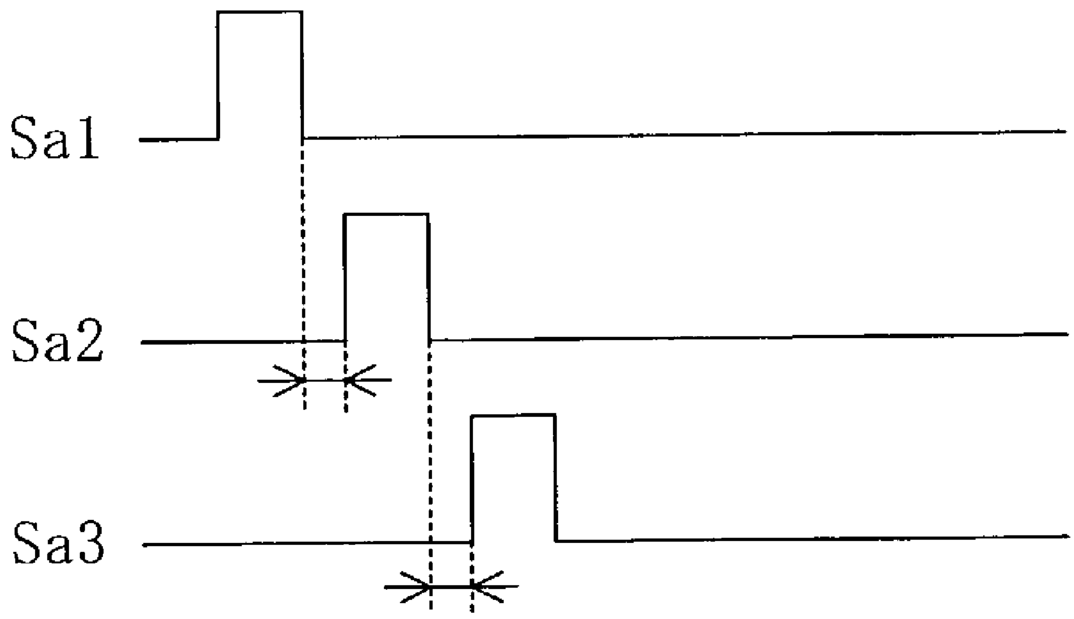
FIG. 11 is a timing chart illustrating signals for controlling second switches 1207*a*1, 1207*a*2 and 1207*a*3 that are connected to a read-out line 1208*a* in Embodiment 5.

FIG. 11 illustrates an example of a set of signals for controlling the second switches 1207*a*1, 1207*a*2 and 1207*a*3 that are connected to one of the plurality of read-out lines 1208*a*, 1208*b* and 1208*c*, e.g., the read-out line 1208*a*. If the second switches 1207*a*1, 1207*a*2 and 1207*a*3 are turned ON simultaneously, the read-out signals are mixed together on the read-out line 1208*a*, thereby failing to perform a proper inspection. In view of this, signals Sa1 to Sa3 are controlled so that adjacent two of the signals, i.e., Sa1 and Sa2, or Sa2 and Sa3, will not be ON at the same time.

The read-out lines 1208*a*, 1208*b* and 1208*c* can control the second switches 1207*a*, 1207*b* and 1207*c*, respectively, and independently of one another. For example, the second switch 1207*a*1 connected to the read-out line 1208*a*, the second switch 1207*b*1 connected to the read-out line 1208*b*, and the second switch 1207*c*1 connected to the read-out line 1208*c* may be turned ON simultaneously. The signals for controlling the second switches 1207*a*, 1207*b* and 1207*c* may be the output signals from the shift register, which are signals for latching data of the source line driving circuit 8 by the 1st latch circuit 1202, or may alternatively be external signals. Moreover, the reading speed does not need to be equal to the writing speed. For example, if there is a speed-limiting factor in the reading system, the reading speed may be lower.

In the present embodiment, a plurality of read-out lines (1208*a*, 1208*b* and 1208*c*) are provided. Therefore, the three read-out lines 1208*a*, 1208*b* and 1208*c* can be read out simultaneously, or the read-out lines 1208*a*, 1208*b* and 1208*c* may alternatively be read out one at a time, e.g., in a sequence of 1208*a*, 1208*b* and 1208*c*. While three read-out lines are provided in the present embodiment, the number of read-out lines to be provided is not limited thereto.

The charges of the storage capacitors 2 of the picture elements, which have been read out to the read-out lines 1208*a*, 1208*b* and 1208*c*, are amplified by an external analog amplifier (not shown), converted by an AD converter (not shown) into a digital signal, and processed by a PC (personal computer). In the present embodiment, a plurality of read-out lines (1208*a*, 1208*b* and 1208*c*) are provided. Therefore, in order to read out data from a plurality of lines simultaneously, there are required a plurality of external analog amplifiers and a plurality of AD converters. Alternatively, data can be read out through the plurality of read-out lines 1208*a*, 1208*b* and 1208*c* while using one read-out line at a time by time-division multiplexing. In such a case, it is not always necessary to provide a plurality of external analog amplifiers and a plurality of AD converters, and it is possible to reduce the number of circuits required for reading out data.

According to the present embodiment, even if the DA converter 1204 is provided in the digital driving circuit at the output stage for outputting date to the source line 1206, i.e., even if the signal flow is irreversible in the source line driving circuit 8, the charges stored in the storage capacitors of the picture elements of the active matrix substrate can be read out, whereby the active matrix substrate can be inspected. Therefore, it is possible to increase the production efficiency and to reduce the production cost by not passing defective substrates to subsequent production steps. Furthermore, in the present embodiment, a plurality of read-out lines (1208*a*, 1208*b* and 1208*c*) are provided. Therefore, the inspection time can be further reduced when data are read out through a plurality of lines simultaneously.

Note that the configuration used in the write operation of the digital source line driving circuit 8 is not limited to that of the present embodiment, but may alternatively be any other suitable configuration.

Embodiment 6

In the present embodiment, an active matrix substrate according to the second aspect of the present invention will be described. The active matrix substrate of the present embodiment is an active matrix substrate with a built-in driving circuit, wherein the source line driving circuit is a digital driver. Note that the active matrix section is similar to that in Embodiment 1, and will not be further described below.

Figure 12:
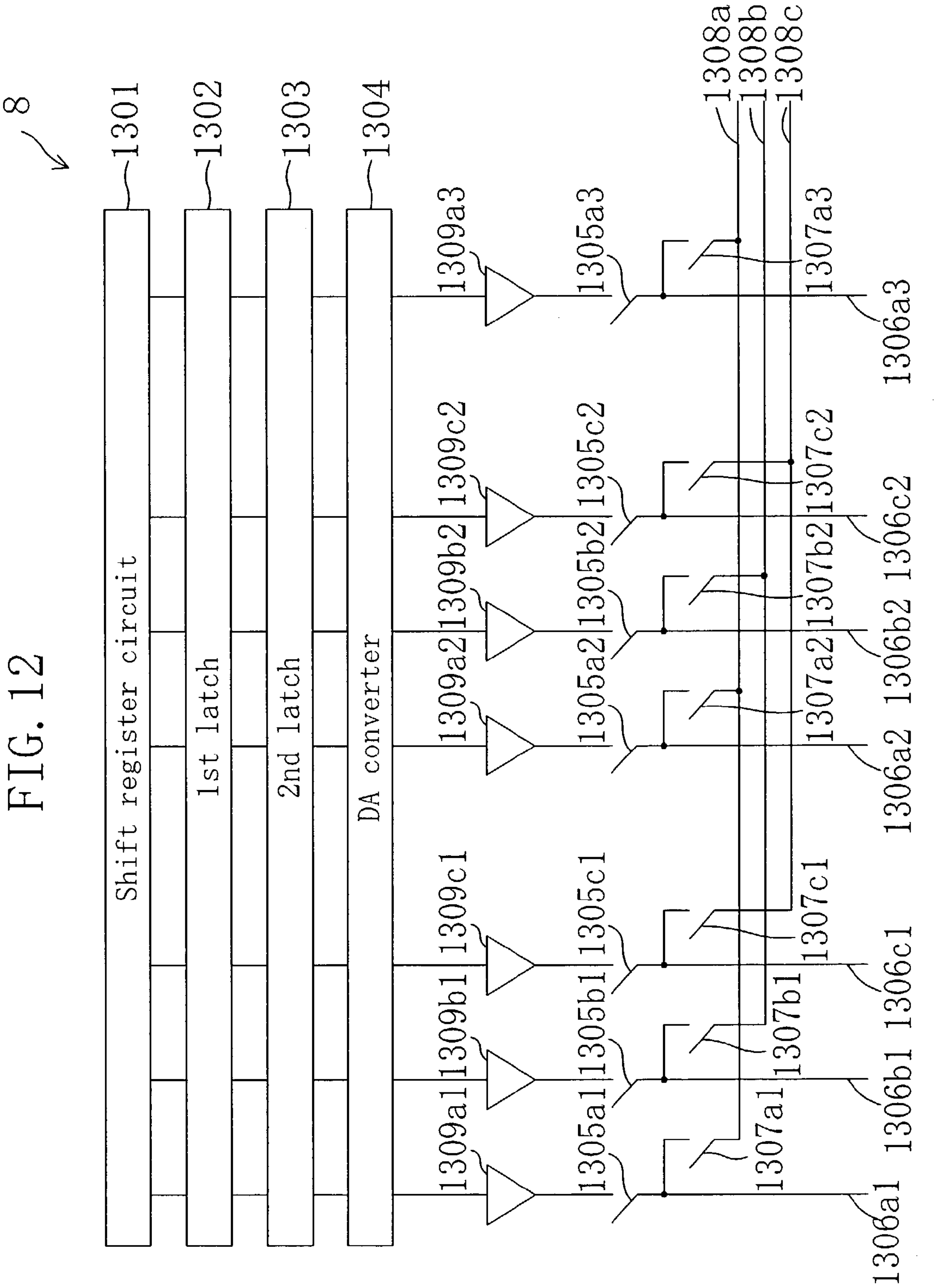
FIG. 12 is a block diagram illustrating an enlarged view of a portion of an active matrix substrate of Embodiment 6 around the source line driving circuit 8.

FIG. 12 is a block diagram illustrating an enlarged view of a portion of the active matrix substrate of the present embodiment around the source line driving circuit 8. In the active matrix substrate of the present embodiment, data is first written to the storage capacitor of each picture element, and then the stored data is read out and analyzed for inspecting the active matrix substrate, as in Embodiment 1. The write operation will be described with reference to FIG. 1 and FIG. 12.

The source line driving circuit 8 includes a shift register circuit 1301, a 1st latch circuit 1302, a 2nd latch circuit 1303 and a DA converter 1304. During a write operation, digital data is latched by the 1st latch circuit 1302 according to the output of the shift register circuit 1301. After latching all data for one horizontal line, the data is transferred to the 2nd latch circuit 1303, and the 1st latch circuit 1302 starts latching data for the next horizontal line. The digital data latched by the 2nd latch circuit 1303 is converted by the DA converter 1304 into analog data needed for active matrix driving. The DA converter 1304 may be a DA converter of a resistance-division type or a capacitance-division type, either of which can be used with the present invention. The output of DA converter 1304 is sent to the amplifier 1309. Note that the amplifiers 1309*a,* 1309*b* and 1309*c* are provided for current amplification since the source lines 1306*a,* 1306*b* and 1306*c* having a large load cannot be charged with the original writing data. In the amplifiers 1309*a,* 1309*b* and 1309*c,* the signal flow is irreversible.

During a write operation, the source lines 1306*a,* 1306*b* and 1306*c* are charged with the data voltage by simultaneously or successively turning ON first switches 1305*a,* 1305*b* and 1305*c* while turning OFF second switches 1307*a,* 1307*b* and 1307*c*. When the picture element transistors 1 that are connected to the gate line 6 selected by the gate line driving circuit 5 are turned ON, the data voltage is written to the storage capacitors 2 of the picture elements from the source lines 1306*a,* 1306*b* and 1306*c* via the picture element transistors 1. A charge corresponding to the difference between the voltage of the common power supply and that of the video signal is written to the storage capacitor 2. For the purpose of inspection, data to be written is preferably constant data in view of the defect-detecting efficiency, and the data to be written may be, for example, the maximum writing voltage.

Next, the read operation for reading out the writing data will be described. During a read operation, the first switches 1305*a,* 1305*b* and 1305*c* are turned OFF so as to disconnect the amplifiers 1309*a,* 1309*b* and 1309*c* from the source lines 1306*a,* 1306*b* and 1306*c,* respectively. The charges stored in the storage capacitors 2 of the picture elements that are connected to the gate line 6 selected by the gate line driving circuit 5 are read out through the source lines 1306*a,* 1306*b* and 1306*c* via the respective picture element transistors 1 being turned ON.

Figure 13:
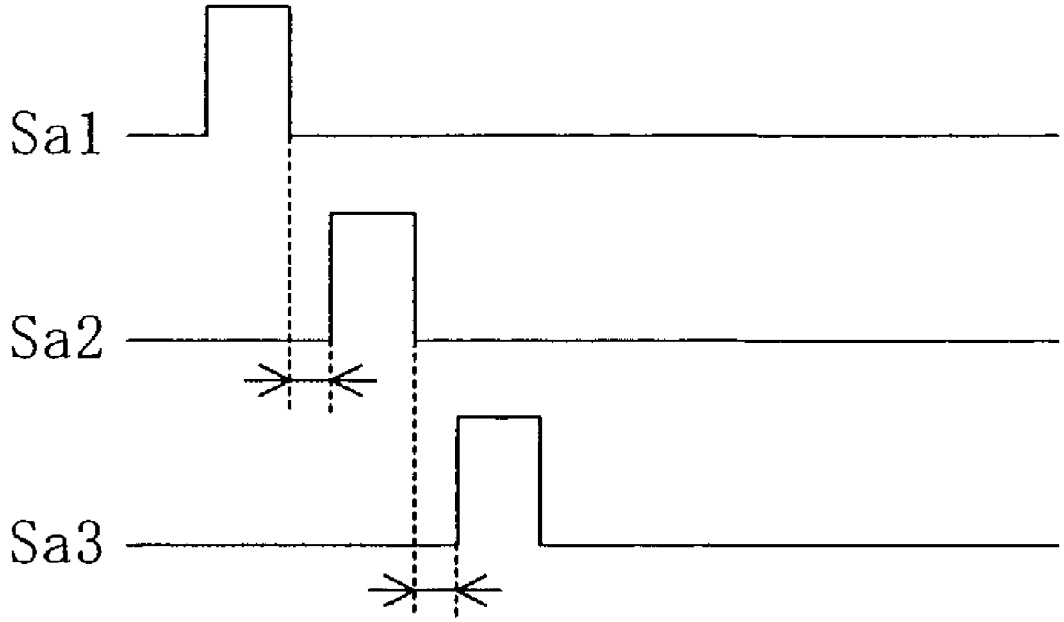
FIG. 13 is a timing chart illustrating signals for controlling second switches 1307*a*1, 1307*a*2 and 1307*a*3 that are connected to a read-out line 1308*a* in Embodiment 6.
Figure 14:
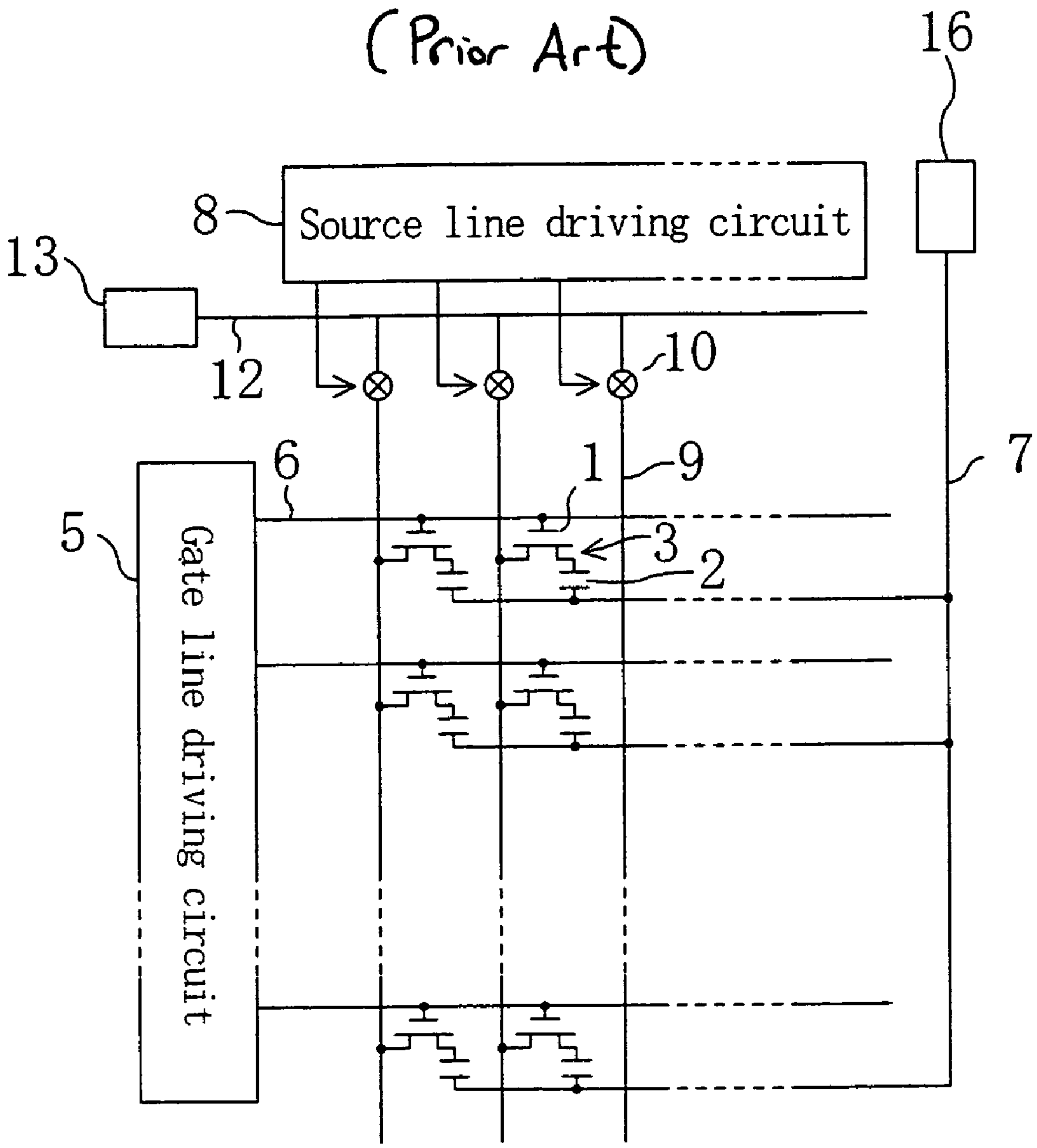
FIG. 14 (Prior Art)
FIG. 14 is a diagram illustrating the inside of a panel of a display device with a built-in driving circuit.
Figure 15:
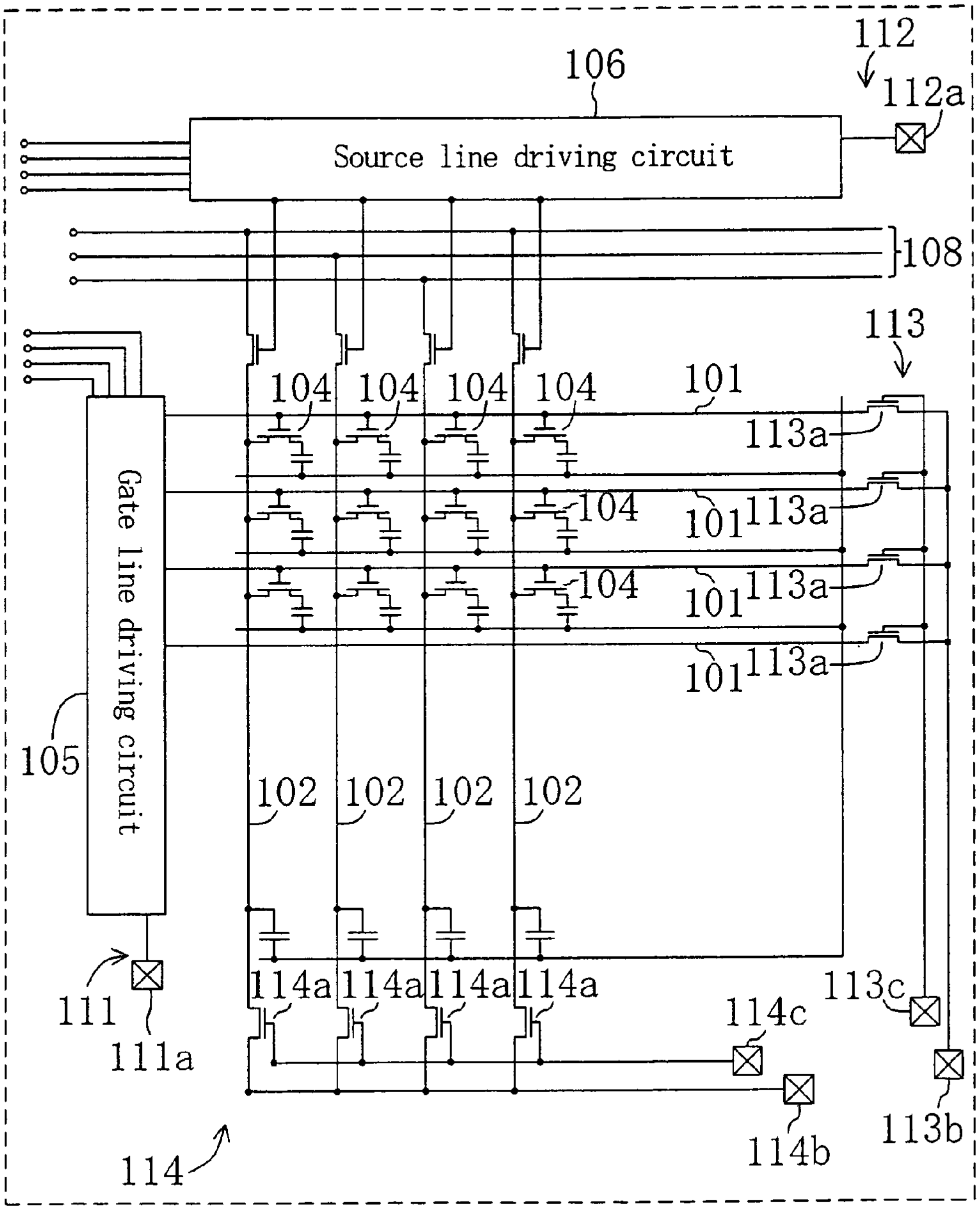
FIG. 15 (Prior Art)
FIG. 15 is a circuit diagram illustrating a conventional active matrix substrate with a built-in driving circuit capable of inspecting the driving circuit and the bus lines.
Figure 16:
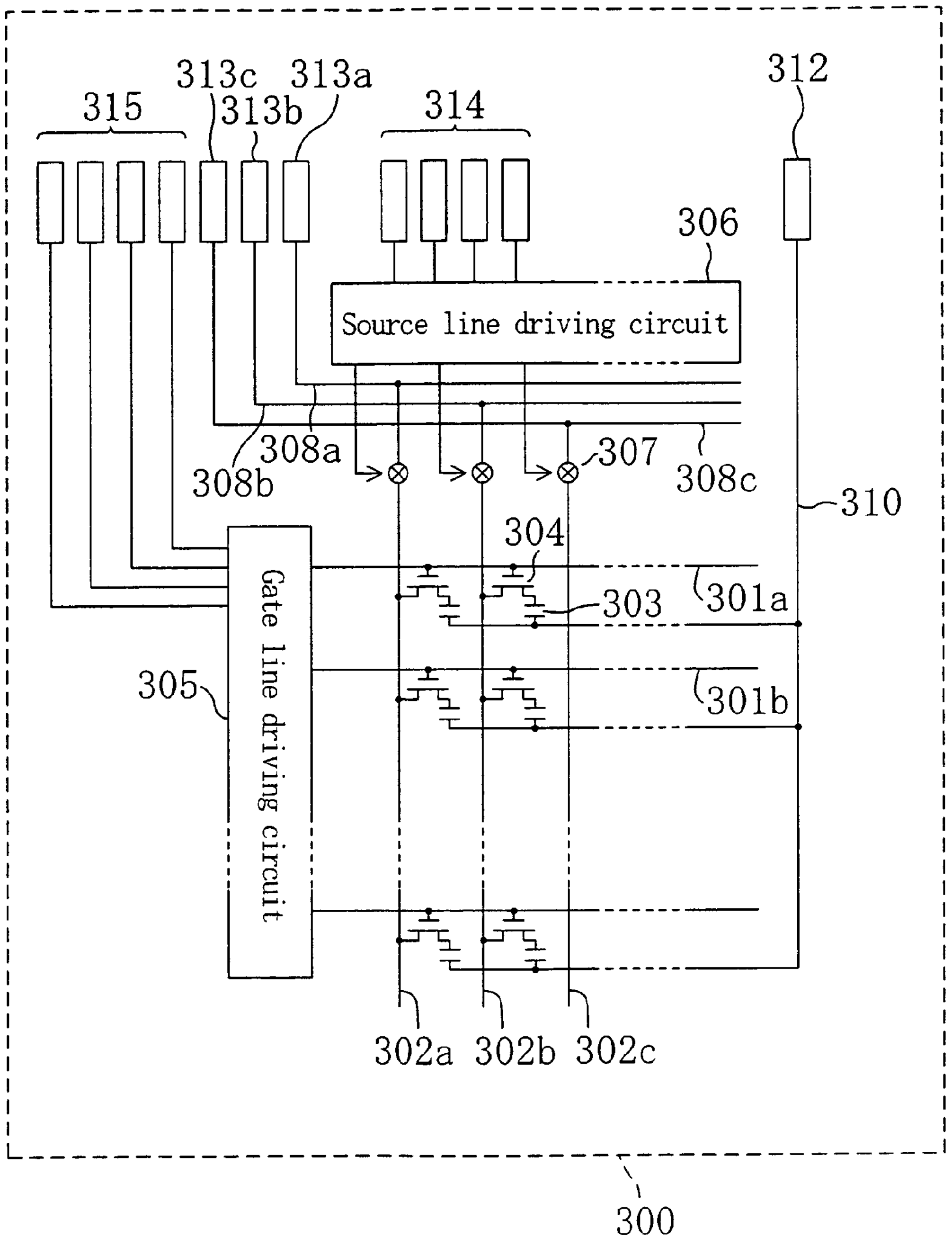
FIG. 16 (Prior Art)
FIG. 16 is a circuit diagram illustrating a conventional active matrix substrate with a built-in driving circuit capable of inspecting not only the condition of the driving circuit and the bus lines but also the condition of the picture element transistors.
Figure 17:
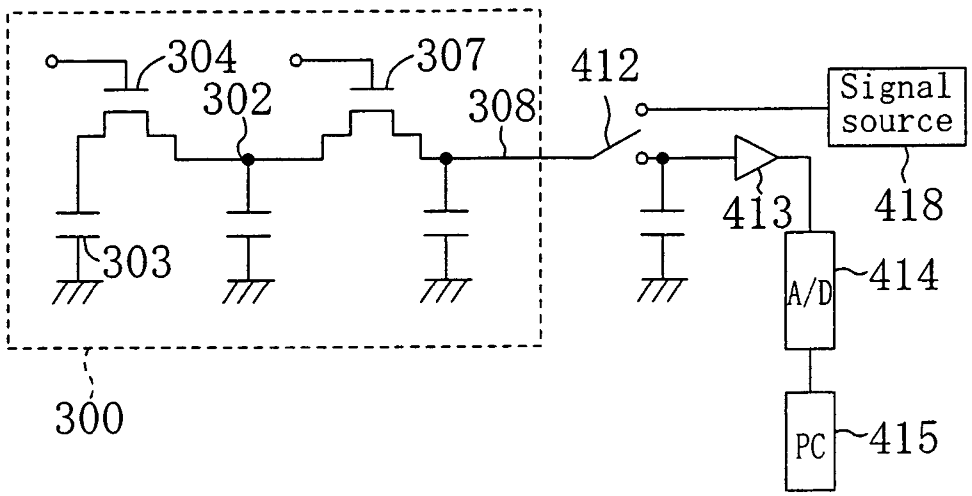
FIG. 17 (Prior Art)
FIG. 17 is an equivalent circuit diagram illustrating a system for detecting picture element defects by writing and then reading out signals in the active matrix substrate illustrated in FIG. 16.
Figure 18:
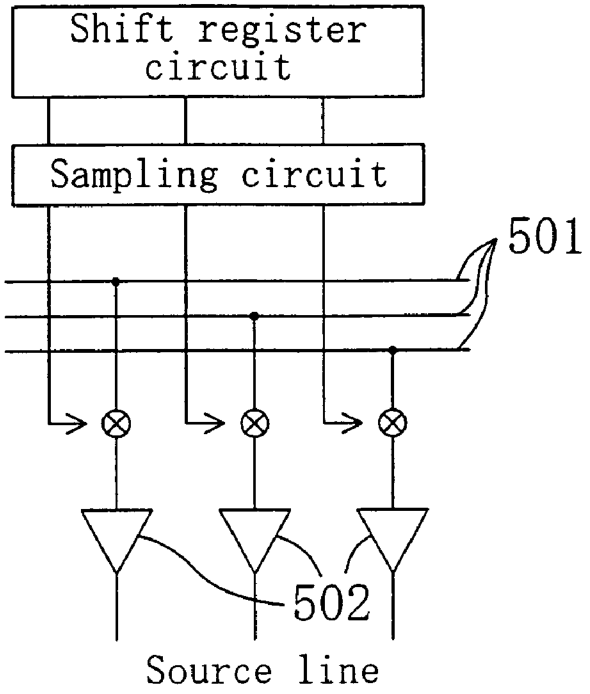
FIG. 18 (Prior Art)
FIG. 18 is a diagram illustrating an analog source line driving circuit with an amplifier at the output stage for outputting data to a source line.
Figure 19:
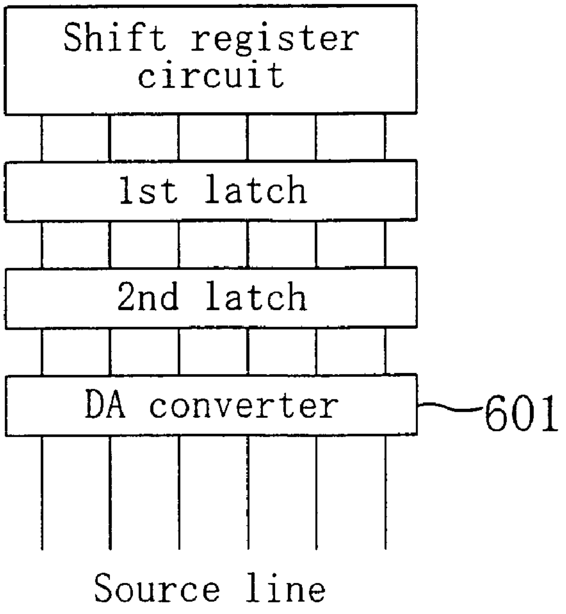
FIG. 19 (Prior Art)
FIG. 19 is a diagram illustrating a digital source line driving circuit.

FIG. 13 illustrates an example of a set of signals for controlling the second switches 1307*a*1, 1307*a*2 and 1307*a*3 that are connected to one of the plurality of read-out lines 1308*a,* 1308*b* and 1308*c,* e.g., the read-out line 1308*a*. If the second switches 1307*a*1, 1307*a*2 and 1307*a*3 are turned ON simultaneously, the read-out signals are mixed together on the read-out line 1308*a,* thereby failing to perform a proper inspection. In view of this, signals Sa1 to Sa3 are controlled so that adjacent two of the signals, i.e., Sa1 and Sa2, or Sa2 and Sa3, will not be ON at the same time.

The read-out lines 1308*a,* 1308*b* and 1308*c* can control the second switches 1307*a,* 1307*b* and 1307*c,* respectively, and independently of one another. For example, the second switch 1307*a*1 connected to the read-out line 1308*a,* the second switch 1307*b*1 connected to the read-out line 1308*b,* and the second switch 1307*c*1 connected to the read-out line 1308*c* may be turned ON simultaneously. The signals for controlling the second switches 1307*a,* 1307*b* and 1307*c* may be the output signals from the shift register, which are signals for latching data of the source line driving circuit 8 by the 1st latch circuit 1302, or may alternatively be external signals. Moreover, the reading speed does not need to be equal to the writing speed. For example, if there is a speed-limiting factor in the reading system, the reading speed may be lower.

In the present embodiment, a plurality of read-out lines (1308*a,* 1308*b* and 1308*c*) are provided. Therefore, the three read-out lines 1308*a,* 1308*b* and 1308*c* can be read out simultaneously, or the read-out lines 1308*a,* 1308*b* and 1308*c* may alternatively be read out one at a time, e.g., in a sequence of 1308*a,* 1308*b* and 1308*c.* While three read-out lines are provided in the present embodiment, the number of read-out lines to be provided is not limited thereto.

The charges of the storage capacitors 2 of the picture elements, which have been read out to the read-out lines 1308*a,* 1308*b* and 1308*c,* are amplified by an external analog amplifier (not shown), converted by an AD converter (not shown) into a digital signal, and processed by a PC (personal computer). In the present embodiment, a plurality of read-out lines (1308*a,* 1308*b* and 1308*c*) are provided. Therefore, in order to read out data from a plurality of lines simultaneously, there are required a plurality of external analog amplifiers and a plurality of AD converters. Alternatively, data can be read out through the plurality of read-out lines 1308*a,* 1308*b* and 1308*c* while using one read-out line at a time by time-division multiplexing. In such a case, it is not always necessary to provide a plurality of external analog amplifiers and a plurality of AD converters, and it is possible to reduce the number of circuits required for reading out data.

According to the present embodiment, even if the amplifier 1309 is provided in the digital driving circuit at the output stage for outputting date to the source line 1306, i.e., even if the signal flow is irreversible in the source line driving circuit 8, the charges stored in the storage capacitors of the picture elements of the active matrix substrate can be read out, whereby the active matrix substrate can be inspected. Therefore, it is possible to increase the production efficiency and to reduce the production cost by not passing defective substrates to subsequent production steps. Furthermore, in the present embodiment, a plurality of read-out lines (1308*a,* 1308*b* and 1308*c*) are provided. Therefore, the inspection time can be further reduced when data are read out through a plurality of lines simultaneously.

Note that the configuration used in the write operation of the digital source line driving circuit 8 is not limited to that of the present embodiment, but may alternatively be any other suitable configuration.

Embodiment 7

A method for producing an active matrix substrate of the present invention includes the steps of: reading out a charge stored in each of a plurality of storage capacitors on an active matrix substrate as described above in Embodiment 1 to Embodiment 6; and analyzing data of the read-out charges by a PC, or the like, to inspect the active matrix substrate. In this way, it is possible to inspect the active matrix substrate after the picture element transistors 1, etc., are formed thereon, so that it can be forwarded to the assembly step of attaching the active matrix substrate to the counter substrate and the liquid crystal injection step, after correcting any defects, if possible. Note that it is preferred that the active matrix substrate is inspected again after it is assembled into a liquid crystal panel.

According to the present invention, in an active matrix substrate with a source line driving circuit, even if the signal flow is irreversible in the source line driving circuit, it is possible to inspect the active matrix substrate by reading out the charges from the storage capacitors of the picture elements on the active matrix substrate. Therefore, it is possible to increase the production efficiency and to reduce the production cost by not passing defective substrates to subsequent production steps.

Embodiment 8

An image display device of the present invention includes an active matrix substrate of the present invention, a counter electrode opposing the active matrix substrate, and a display medium layer interposed between picture element electrodes of the active matrix substrate and a counter electrode. A liquid crystal display device will now be described as an example of the image display device of the present invention.

The liquid crystal display device of the present embodiment includes an active matrix substrate of the present invention, a counter substrate opposing the active matrix substrate, and a liquid crystal layer interposed between the active matrix substrate and the counter substrate. A common electrode is formed on one side of the counter substrate that is closer to the liquid crystal layer. Furthermore, an alignment film, which has been subjected to a rubbing treatment, is formed so as to cover the common electrode. Moreover, a color filter layer including R, G and B color filter portions and an alignment film, which has been subjected to a rubbing treatment, are formed on one side of the active matrix substrate that is closer to the liquid crystal layer. The active matrix substrate and the counter substrate are attached to each other via a sealant with a gap between the substrates. The gap is filled with a liquid crystal material to form a liquid crystal layer.

Using the gate line driving circuit 5 and the source line driving circuit 8, switching of the picture element transistor 1 is controlled for each picture element to control the voltage application to the plurality of picture element electrodes arranged in a matrix pattern. Thus, the transmittance of the liquid crystal layer is controlled for each picture element to realize a gray-scale display.

The liquid crystal display device of the present embodiment may be of any of various types, including a reflection type, a transmission type and a transmission/reflection type. For example, a transmission type liquid crystal display device is obtained when the picture element electrodes are made of a transparent conductive film such as ITO (Indium Tin Oxide), and a reflection type liquid crystal display device is obtained when the picture element electrodes are made of a reflective conductive film such as aluminum. Moreover, using reflective picture element electrodes with openings therein, it is possible to obtain a transmission/reflection type liquid crystal display device in which each picture element includes a reflection region and a transmission region.

While the present invention has been described in preferred embodiments, it will be apparent to those skilled in the art that the disclosed invention may be modified in numerous ways and may assume many embodiments other than those specifically set out and described above. Accordingly, it is intended by the appended claims to cover all modifications of the invention that fall within the true spirit and scope of the invention.

What is claimed is:

1. An active matrix substrate, comprising:

a plurality of transistors arranged in a lattice pattern on a substrate;

a plurality of gate lines extending in parallel to one another and connected to respective gates of the plurality of transistors;

a plurality of source lines extending in parallel to one another so as to cross the plurality of gate lines and connected to respective sources of the plurality of transistors, the source lines being in communication with at least one video line;

a gate line driving circuit for sending a scanning signal to the plurality of gate lines;

a plurality of storage capacitors connected respectively to the plurality of transistors and to a common power supply;

a source line driving circuit for successively selecting the plurality of source lines so as to send video signal(s) from the at least one video line to the storage capacitors via the source lines being selected; and a read-out line for reading out charges stored in the plurality of storage capacitors via respective ones of the plurality of source lines, wherein:

the read-out line is a single line shared by the plurality of source lines;

wherein the active matrix substrate further comprises:

a first switch interposed between each of the source lines and the source line driving circuit, a second switch interposed between each of the source lines and the read-out line; and wherein the first and second switches are provided in series between the read-out line and the video line.

2. The active matrix substrate of claim 1, wherein the plurality of switches are arranged so that a period during which the connection between one of the source lines and the read-out line is turned ON does not overlap with a period during which the connection between another one of the source lines and the read-out line is turned ON.

3. The active matrix substrate of claim 2, wherein the source line driving circuit includes a shift register circuit, and the plurality of switches are controlled by using shift register outputs from the shift register circuit.

4. The active matrix substrate of claim 1, further comprising a plurality of amplifiers, each of the plurality of amplifiers being interposed between the source line driving circuit and a corresponding one of the plurality of switches, and wherein the source line driving circuit is an analog source line driving circuit.

5. The active matrix substrate of claim 1, wherein the source line driving circuit is a digital source line driving circuit.

6. A method for producing an active matrix substrate, comprising the steps of:

reading out charges stored in the plurality of storage capacitors of the active matrix substrate of claim 1; and analyzing data of the read-out charges to inspect the active matrix substrate.

7. An image display device, comprising:

the active matrix substrate of claim 1 including a plurality of picture element electrodes connected to the plurality of transistors, respectively;

a counter electrode opposing the active matrix substrate; and a display medium layer interposed between the picture element electrodes and the counter electrode.

8. An active matrix substrate, comprising:

a plurality of transistors arranged in a lattice pattern on a substrate;

a plurality of gate lines extending in parallel to one another and connected to respective gates of the plurality of transistors;

a plurality of source lines extending in parallel to one another so as to cross the plurality of gate lines and connected to respective sources of the plurality of transistors;

a gate line driving circuit for sending a scanning signal to the plurality of gate lines;

a plurality of storage capacitors connected respectively to the plurality of transistors and to a common power supply;

a source line driving circuit for successively selecting the plurality of source lines so as to send a video signal from at least one video line to the storage capacitors via the source lines being selected; and a read-out line for reading out charges stored in the plurality of storage capacitors via respective ones of the plurality of source lines, wherein:

the read-out line is a plurality of lines corresponding to the plurality of source lines, respectively;

wherein the active matrix substrate further comprises:

a first switch interposed between each of the source lines and the source line driving circuit, and a second switch interposed between each of the source lines and the read-out line; and wherein the first and second switches are provided in series between the read-out line and the video line.

9. The active matrix substrate of claim 8, wherein the plurality of switches are arranged so that a period during which the connection between one of the source lines and one of the read-out lines is turned ON does not overlap with a period during which the connection between the one of the source lines and another one of the read-out lines is turned ON.

10. The active matrix substrate of claim 9, wherein the source line driving circuit includes a shift register circuit, and the plurality of switches are controlled by using shift register outputs from the shift register circuit.

11. The active matrix substrate of claim 8, further comprising a plurality of amplifiers, each of the plurality of amplifiers being interposed between the source line driving circuit and a corresponding one of the plurality of switches, and wherein the source line driving circuit is an analog source line driving circuit.

12. The active matrix substrate of claim 8, wherein the source line driving circuit is a digital source line driving circuit.

13. The active matrix substrate of claim 8, wherein charges stored in the plurality of storage capacitors are read out through the plurality of read-out lines simultaneously.

14. The active matrix substrate of claim 8, wherein charges stored in the plurality of storage capacitors are read out through the plurality of read-out lines while using one read-out line at a time by time-division multiplexing.

15. A method for producing an active matrix substrate, comprising the steps of:

reading out charges stored in the plurality of storage capacitors of the active matrix substrate of claim 6; and analyzing data of the read-out charges to inspect the active matrix substrate.

16. An image display device, comprising:

the active matrix substrate of claim 8 including a plurality of picture element electrodes connected to the plurality of transistors, respectively;

a counter electrode opposing the active matrix substrate; and a display medium layer interposed between the picture element electrodes and the counter electrode.

17. A liquid crystal display device including an active matrix substrate, comprising:

a plurality of transistors arranged on an active substrate of the liquid crystal display device;

a plurality of gate lines electrically connected to respective gates of the transistors;

a plurality of source lines electrically connected to respective sources of the transistors;

a gate line driving circuit for sending scanning signal(s) to the gate lines;

a plurality of storage capacitors electrically connected respectively to the plurality of transistors;

a source line driving circuit for selecting the plurality of source lines so as to send video signal(s) from at least one video line to the storage capacitors via the source lines being selected; and a read-out line for reading out charges stored in the plurality of storage capacitors via respective ones of the plurality of source lines, wherein:

the read-out line is shared by the plurality of source lines;

wherein the active matrix substrate further comprises:

a first switch interposed between at least one of the source lines and the source line driving circuit, a second switch interposed between the at least one source line and the read-out line; and wherein the first and second switches are provided in series between the read-out line and the video line.

* * * * *

UNITED STATES PATENT AND TRADEMARK OFFICE

CERTIFICATE OF CORRECTION

PATENT NO. : 7,167,151 B2
APPLICATION NO. : 10/360931
DATED : January 23, 2007
INVENTOR(S) : Yamashita It is certified that error appears in the above-identified patent and that said Letters Patent is hereby corrected as shown below:

On The Title Page,

Item (56) References Cited

Foreign Patent Documents:

JP 2002-222261 is incorrect as listed on the 2nd page.

Should be -- JP 2001-222261 8/2001 --.

Signed and Sealed this

Eighteenth Day of March, 2008

JON W. DUDAS
*Director of the United States Patent and Trademark Office*